US012408298B2

(12) United States Patent
Chae et al.

(10) Patent No.: US 12,408,298 B2
(45) Date of Patent: Sep. 2, 2025

(54) VEHICULAR COOLANT SYSTEM AND METHOD OF CONTROLLING THE SAME

(71) Applicants: HYUNDAI MOTOR COMPANY, Seoul (KR); KIA CORPORATION, Seoul (KR)

(72) Inventors: Jae Min Chae, Seoul (KR); Chang Gi Ryu, Seoul (KR); Soo Il Lee, Hwaseong-si (KR); Dae Hyun Song, Seoul (KR); Seung Ryeol Lee, Hwaseong-si (KR); Jong Dae Gwak, Anyang-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 205 days.

(21) Appl. No.: 18/488,716

(22) Filed: Oct. 17, 2023

(65) Prior Publication Data
US 2025/0031345 A1    Jan. 23, 2025

(30) Foreign Application Priority Data
Jul. 17, 2023    (KR) ........................ 10-2023-0092615

(51) Int. Cl.
*H05K 7/20*    (2006.01)
*B60H 1/00*    (2006.01)
(Continued)

(52) U.S. Cl.
CPC ..... *H05K 7/20281* (2013.01); *B60H 1/00278* (2013.01); *B60L 58/26* (2019.02);
(Continued)

(58) Field of Classification Search
CPC .......... H05K 7/20281; H05K 7/20263; H05K 7/20272; H05K 7/20927; H01M 10/613;
(Continued)

(56) References Cited

U.S. PATENT DOCUMENTS

| | | | | |
|---|---|---|---|---|
| 4,415,847 A | * | 11/1983 | Galloway | ............. B60L 53/302 165/300 |
| 6,329,723 B1 | * | 12/2001 | Hilpert | ...................... B60L 9/00 123/41.12 |

(Continued)

FOREIGN PATENT DOCUMENTS

WO    WO-2012022507 A2 *    2/2012    ............. F01P 7/165

*Primary Examiner* — Anatoly Vortman
(74) *Attorney, Agent, or Firm* — Fish & Richardson P.C.

(57) ABSTRACT

A coolant system includes a battery coolant line fluidly connected to a battery, a power electronics coolant line fluidly connected to a power electronic component, a radiator coolant line fluidly connected to a radiator, a control valve configured to allow the battery coolant line, the power electronics coolant line, and the radiator coolant line to be fluidly connected to or separated from each other, a temperature sensor disposed in at least one of the battery coolant line, the power electronics coolant line, or the radiator coolant line, and a controller configured to control a switching operation of the control valve under a predetermined condition in a manner that fluidly connects a coolant line without any temperature sensor to a coolant line with the temperature sensor, and determine a temperature of a coolant passing through the coolant line without any temperature sensor based on a temperature sensed by the temperature sensor.

15 Claims, 8 Drawing Sheets

(51) Int. Cl.
*B60L 58/26* (2019.01)
*H01M 10/48* (2006.01)
*H01M 10/613* (2014.01)
*H01M 10/625* (2014.01)
*H01M 10/635* (2014.01)
*H01M 10/6568* (2014.01)
*H01M 10/663* (2014.01)

(52) U.S. Cl.
CPC ....... *H01M 10/486* (2013.01); *H01M 10/613* (2015.04); *H01M 10/625* (2015.04); *H01M 10/635* (2015.04); *H01M 10/6568* (2015.04); *H01M 10/663* (2015.04); *H05K 7/20263* (2013.01); *H05K 7/20272* (2013.01); *H05K 7/20927* (2013.01); *B60H 2001/00307* (2013.01); *B60H 1/00921* (2013.01); *B60H 2001/00928* (2013.01); *B60L 2240/545* (2013.01); *H01M 2220/20* (2013.01)

(58) Field of Classification Search
CPC ............ H01M 10/625; H01M 10/635; H01M 10/6568; H01M 10/663; H01M 10/486; H01M 2220/20; B60L 58/26; B60L 2240/545; B60H 1/00278; B60H 1/00921; B60H 2001/00307; B60H 2001/00928

USPC .................................. 361/699; 700/299, 300
See application file for complete search history.

(56) References Cited

U.S. PATENT DOCUMENTS

| | | | |
|---|---|---|---|
| 6,394,210 B2* | 5/2002 | Matsuda ................ | B60H 1/004 903/903 |
| 6,481,230 B2* | 11/2002 | Kimishima ............. | B60L 53/11 62/238.7 |
| 7,451,808 B2* | 11/2008 | Busse ...................... | F01P 3/20 62/238.7 |
| 10,259,291 B2* | 4/2019 | Aldridge ................. | B60L 58/27 |
| 11,331,979 B2* | 5/2022 | Jeong .................. | B60H 1/00278 |
| 11,659,696 B2* | 5/2023 | McEathron ........ | H05K 7/20881 361/679.47 |
| 2019/0039439 A1* | 2/2019 | Aldridge ................. | B60L 58/26 |
| 2020/0070619 A1* | 3/2020 | Kim ....................... | B60H 1/00921 |
| 2022/0161630 A1* | 5/2022 | Lindquist ................ | B60L 1/003 |
| 2022/0181722 A1* | 6/2022 | Kim ....................... | B60K 11/02 |
| 2022/0355645 A1* | 11/2022 | Jeong .................. | B60H 1/00664 |
| 2023/0104670 A1* | 4/2023 | Mothier ............ | H01M 8/04037 429/437 |
| 2023/0158908 A1* | 5/2023 | Hou ...................... | B60L 3/0046 320/109 |
| 2024/0353188 A1* | 10/2024 | Reddy .............. | H01M 10/6569 |

* cited by examiner

VEHICULAR COOLANT SYSTEM AND METHOD OF CONTROLLING THE SAME

CROSS-REFERENCE TO RELATED APPLICATION

This application is based on and claims the benefit of priority to Korean Patent Application No. 10-2023-0092615, filed on Jul. 17, 2023, in the Korean Intellectual Property Office, the disclosure of which is incorporated herein in its entirety by reference.

TECHNICAL FIELD

The present disclosure relates to a vehicular coolant system and a method of controlling the same, and more particularly, to a vehicular coolant system and a method of controlling the same designed to improve electric efficiency as well as achieving cost savings by reducing the number of temperature sensors provided in an integrated coolant system for maintaining a power electronic component and/or a battery at appropriate temperatures.

BACKGROUND

With a growing interest in energy efficiency and environmental issues, there is a demand for development of eco-friendly vehicles that can replace internal combustion engine vehicles. Such eco-friendly vehicles are classified into electric vehicles which are driven using fuel cells or electricity as a power source and hybrid vehicles which are driven using an engine and a battery.

Electric vehicles or hybrid vehicles may include a vehicular thermal management system for air conditioning in a passenger compartment and maintaining a battery and/or a power electronic component at optimal temperatures. The vehicular thermal management system may include a heating, ventilation, and air conditioning (HVAC) system for air conditioning in the passenger compartment, and an integrated coolant system for maintaining the power electronic component of a power electronics system and/or the battery at appropriate temperatures.

The integrated coolant system may include a battery coolant line fluidly connected to the battery, a power electronics coolant line fluidly connected to the power electronic component, and a radiator coolant line fluidly connected to a radiator. The battery coolant line may be thermally connected to the HVAC system through a battery chiller, and the power electronics coolant line may be thermally connected to the HVAC system through a heat exchanger. The radiator may be disposed adjacent to a front grille of the vehicle.

In addition, the integrated coolant system may include a control valve controlling the flow of a coolant between the battery coolant line, the power electronics coolant line, and the radiator coolant line. The battery coolant line, the power electronics coolant line, and the radiator coolant line may be fluidly connected or separated by the control valve, and accordingly the coolant may be allowed to selectively circulate in the battery coolant line, the power electronics coolant line, and/or the radiator coolant line.

The integrated coolant system according to the related art may include a radiator-side temperature sensor provided in the radiator coolant line, and a battery-side temperature sensor provided in the battery coolant line. The radiator-side temperature sensor may sense the temperature of the coolant passing through the radiator coolant line, and the battery-side temperature sensor may sense the temperature of the coolant passing through the battery coolant line. In addition, the temperature of the coolant passing through the power electronics coolant line may be indirectly estimated using a temperature sensor attached to the power electronic component. For example, the power electronic component may be a motor, an inverter, and the like. The inverter may be configured to control the motor, and a heat sink may be attached to a circuit board of the inverter. The power electronics coolant line may be fluidly connected to the heat sink of the inverter, and the temperature sensor may be mounted on the heat sink of the inverter and sense the temperature of the heat sink. When the vehicle is traveling at a constant speed, the temperature of the coolant passing through the power electronics coolant line becomes similar to a temperature sensed by the temperature sensor mounted on the heat sink with an error of about 1° C. Accordingly, the temperature of the coolant passing through the power electronics coolant line may be determined based on the temperature sensed by the temperature sensor mounted on the heat sink.

In the event of a rapid acceleration or deceleration of the vehicle (i.e., rapid changes in vehicle speed or in motor torque), the temperature of the heat sink rapidly changes in response to the changes in vehicle speed, but the temperature of the coolant passing through the power electronics coolant line does not rapidly change in response to the changes in vehicle speed. Accordingly, during the rapid acceleration or deceleration of the vehicle, the temperature sensed by the temperature sensor mounted on the heat sink may considerably differ from the temperature of the coolant passing through the power electronics coolant line. In order to accurately sense the temperature of the coolant passing through the power electronics coolant line, an additional temperature sensor may be provided in the power electronics coolant line. That is, three temperature sensors may be provided in the battery coolant line, the power electronics coolant line, and the radiator coolant line, respectively. As the three temperature sensors are provided, the overall manufacturing cost may increase.

SUMMARY

An aspect of the present disclosure provides a vehicular coolant system and a method of controlling the same designed to improve electric efficiency as well as achieving cost savings by reducing the number of temperature sensors provided in an integrated coolant system for maintaining a power electronic component and/or a battery at appropriate temperatures.

According to an aspect of the present disclosure, a vehicular coolant system may include: a battery coolant line fluidly connected to a battery; a power electronics coolant line fluidly connected to a power electronic component; a radiator coolant line fluidly connected to a radiator; a control valve configured to allow the battery coolant line, the power electronics coolant line, and the radiator coolant line to be fluidly connected to or separated from one another; a temperature sensor disposed at at least one of the battery coolant line, the power electronics coolant line, or the radiator coolant line; and a controller configured to control the control valve to: fluidly connect (i) a first coolant line that does not have the temperature sensor among the battery coolant line, the power electronics coolant line, and the radiator coolant line to (ii) a second coolant line that has the temperature sensor among the battery coolant line, power electronics coolant line, and the radiator coolant line, and determine a first temperature of a coolant passing through the first coolant line based on a second temperature sensed by the temperature sensor disposed at the second coolant line.

The temperature sensor may be disposed at the battery coolant line.

The coolant system may comprise (i) a first temperature sensor disposed at the battery coolant line and (ii) a second temperature sensor disposed at the radiator coolant line.

The coolant system may further include a heat sink temperature sensor disposed at a heat sink of the power electronic component.

The control valve may comprise: a first battery-side port connected to an inlet of the battery coolant line; a second battery-side port connected to an outlet of the battery coolant line; a first power electronic-side port connected to an inlet of the power electronics coolant line; a second power electronic-side port connected to an outlet of the power electronics coolant line; a first radiator-side port connected to an inlet of the radiator coolant line; and a second radiator-side port connected to an outlet of the radiator coolant line.

The control valve may be configured to allow two or more of the first battery-side port, the second battery-side port, the first power electronic-side port, the second power electronic-side port, the first radiator-side port, or the second radiator-side port to selectively communicate with one another.

The coolant system may further include a battery pump fluidly connected to the battery coolant line.

The coolant system may further include a battery chiller that is fluidly connected to the battery coolant line and configured to thermally connect the battery coolant line to a heating, ventilation, and air conditioning (HVAC) system.

The coolant system may further include a power electronic pump fluidly connected to the power electronics coolant line.

The coolant system may further comprise a heat exchanger that is fluidly connected to the power electronics coolant line. The heat exchanger may be configured to thermally connect the power electronics coolant line to an HVAC system.

According to another aspect of the present disclosure, a method for controlling a coolant system including a battery coolant line fluidly connected to a battery, a power electronics coolant line fluidly connected to a power electronic component, a radiator coolant line fluidly connected to a radiator, and a control valve configured to control flow of a coolant through the battery coolant line, the power electronics coolant line, and the radiator coolant line may comprise: obtaining a temperature of a heat sink of the power electronic component; determining whether a variation of the temperature of the heat sink of the power electronic component is greater than or equal to a predetermined threshold in a first circulation mode in which the power electronics coolant line is fluidly separated from the battery coolant line; based on determining that the variation in the temperature of the heat sink of the power electronic component is greater than or equal to the predetermined threshold, switching to a second circulation mode in which the power electronics coolant line is fluidly connected to the battery coolant line; obtaining a first temperature sensed by a temperature sensor that is disposed at the battery coolant line; and determining a second temperature of the coolant passing through the power electronics coolant line based on the first temperature sensed by the temperature sensor disposed at the battery coolant line.

The method may further comprise: based on determining that the variation of the temperature of the heat sink of the power electronic component is less than the predetermined threshold, obtaining a third temperature that is sensed by a heat sink temperature sensor; and determining the second temperature of the coolant passing through the power electronics coolant line based on the third temperature sensed by the heat sink temperature sensor.

According to another aspect of the present disclosure, a method for controlling a coolant system including a battery coolant line fluidly connected to a battery, a power electronics coolant line fluidly connected to a power electronic component, a radiator coolant line fluidly connected to a radiator, and a control valve configured to control flow of a coolant through the battery coolant line, the power electronics coolant line, and the radiator coolant line may include: obtaining a temperature of a heat sink of the power electronic component; determining whether a variation of the temperature of the heat sink of the power electronic component is greater than or equal to a first predetermined threshold in a first circulation mode in which the power electronics coolant line is fluidly separated from the battery coolant line and the radiator coolant line; based on determining that the variation of the temperature of the heat sink of the power electronic component is greater than or equal to the first predetermined threshold, determining a temperature difference between a first temperature of the coolant passing through the battery coolant line and the temperature of the heat sink; determining whether the temperature difference is greater than or equal to a second predetermined threshold; based on determining that the temperature difference is greater than or equal to the second predetermined threshold, switching to a second circulation mode in which the power electronics coolant line is fluidly connected to the radiator coolant line; and obtaining a first sensor temperature sensed by a first temperature sensor disposed at the radiator coolant line; and determining a second temperature of the coolant passing through the power electronics coolant line based on the first sensor temperature sensed by the first temperature sensor disposed at the radiator coolant line.

The method may further include obtaining a second sensor temperature sensed by a heat sink temperature sensor based on determining that the variation of the temperature of the heat sink of the power electronic component is less than the first predetermined threshold; determining the second temperature of the coolant passing through the power electronics coolant line based on the second sensor temperature sensed by the heat sink temperature sensor.

The method may further include: switching to a third circulation mode in which the power electronics coolant line is fluidly connected to the battery coolant line based on determining that the temperature difference is less than the second predetermined threshold; obtaining a second sensor temperature sensed by a second temperature sensor disposed at the battery coolant line; and determining the second temperature of the coolant passing through the power electronics coolant line based on the second sensor temperature sensed by a temperature sensor disposed at the battery coolant line.

DETAILED DESCRIPTION

Figure 1:
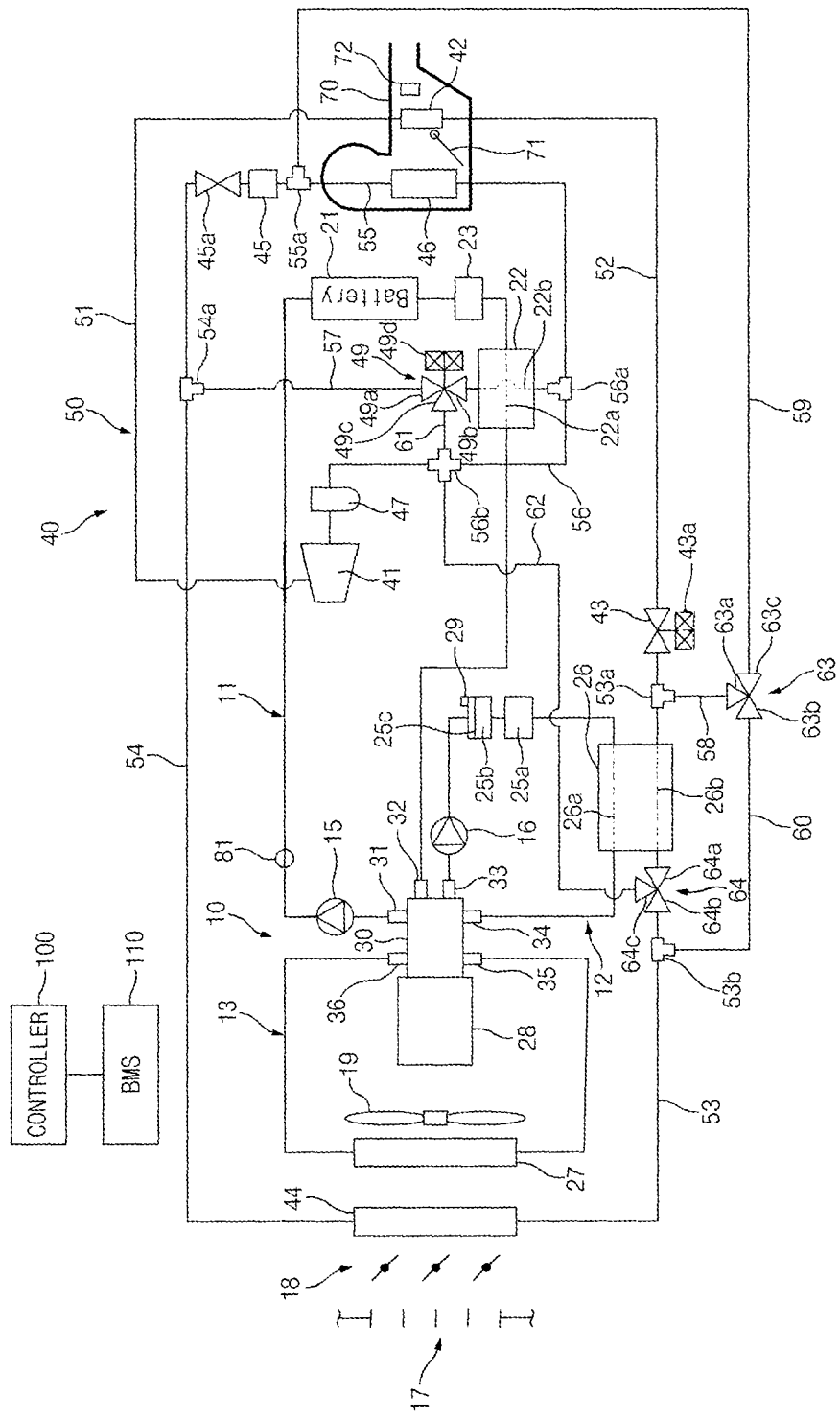
FIG. 1 illustrates an example of a vehicular thermal management system including a coolant system.

Hereinafter, exemplary implementations of the present disclosure will be described in detail with reference to the accompanying drawings. In the drawings, the same reference numerals will be used throughout to designate the same or equivalent elements. In addition, a detailed description of well-known techniques associated with the present disclosure will be ruled out in order not to unnecessarily obscure the gist of the present disclosure.

Referring to FIG. 1, a vehicular thermal management system may include a coolant system 10 configured to maintain a battery 21 and power electronic components 25a and 25b at appropriate temperatures, and a heating, ventilation, and air conditioning (HVAC) system 40 thermally connected to the coolant system 10.

In some implementations, the coolant system 10 may include a battery coolant line 11 fluidly connected to the battery 21, a power electronics coolant line 12 fluidly connected to the power electronic components 25a and 25b, and a radiator coolant line 13 fluidly connected to a radiator 27.

In some examples, the coolant system 10 may further include a control valve 30 allowing the battery coolant line 11, the power electronics coolant line 12, and the radiator coolant line 13 to be fluidly connected to or separated from each other. That is, the battery coolant line 11, the power electronics coolant line 12, and the radiator coolant line 13 may be selectively connected to or separated from each other by various switching operations of the control valve 30 so that the control valve 30 may be configured to control the flow of a coolant between the battery coolant line 11, the power electronics coolant line 12, and the radiator coolant line 13.

The control valve 30 may include a valve housing having a plurality of ports 31, 32, 33, 34, 35, and 36 connected to the battery coolant line 11, the power electronics coolant line 12, and the radiator coolant line 13, and a cylindrical valve member rotatable to selectively open or close the plurality of ports 31, 32, 33, 34, 35, and 36 in the valve housing. The valve member may have a plurality of passages therein, and the rotation of the valve member may cause the passages of the valve member to selectively communicate with the plurality of ports 31, 32, 33, 34, 35, and 36 so that the plurality of ports 31, 32, 33, 34, 35, and 36 may be individually opened or closed, or some of the ports may communicate with each other.

Specifically, the control valve 30 may include a first battery-side port 31 connected to an inlet of the battery coolant line 11, a second battery-side port 32 connected to an outlet of the battery coolant line 11, a first power electronic-side port 33 connected to an inlet of the power electronics coolant line 12, a second power electronic-side port 34 connected to an outlet of the power electronics coolant line 12, a first radiator-side port 35 connected to an inlet of the radiator coolant line 13, and a second radiator-side port 36 connected to an outlet of the radiator coolant line 13.

The control valve 30 may be configured to perform switching operations under control of a controller 100 so that at least some of the first battery-side port 31, the second battery-side port 32, the first power electronic-side port 33, the second power electronic-side port 34, the first radiator-side port 35, or the second radiator-side port 36 may be allowed to selectively communicate with each other. Accordingly, the battery coolant line 11, the power electronics coolant line 12, and the radiator coolant line 13 may be selectively connected to or separated from each other, and the coolant system 10 may operate in any one of a plurality of circulation modes forming various flows of the coolant.

The coolant system 10 may further include a reservoir 28 fluidly connected to the control valve 30, and the reservoir 28 may temporarily store and replenish the coolant so that the circulation rate of the coolant may be kept constant.

The battery coolant line 11 may be fluidly connected to a battery pump 15. The battery 21, a battery warmer 23, and a battery chiller 22 may be fluidly connected to the battery coolant line 11.

The battery 21 may have a coolant passage provided inside or outside thereof, and the coolant may pass through the coolant passage. The battery coolant line 11 may be fluidly connected to the coolant passage of the battery 21.

The battery warmer 23 may be disposed on the upstream or downstream side of the battery 21, and the battery warmer 23 may heat the coolant circulating in the battery coolant line 11 so that the battery 21 may be warmed up by the heated coolant. In some examples, the battery warmer 23 may be an electric heater. In some examples, the battery warmer 23 may be a heater configured to heat a battery coolant by exchanging heat with a high-temperature fluid. Referring to FIG. 1, the battery warmer 23 may be disposed on the downstream side of the battery 21 in a coolant flow direction.

The battery pump 15 may allow the coolant to circulate, and an inlet of the battery pump 15 may communicate with the first battery-side port 31 of the control valve 30. Accordingly, the coolant discharged from the first battery-side port 31 of the control valve 30 may be sucked into the inlet of the battery pump 15. Referring to FIG. 1, the battery pump 15 may be disposed on the upstream side of the battery 21.

The battery chiller 22 may be disposed on the upstream or downstream side of the battery 21, and the battery chiller 22 may be configured to thermally connect the HVAC system 40 and the battery coolant line 11. Referring to FIG. 1, the battery chiller 22 may include a first passage 22a fluidly connected to the battery coolant line 11, and a second passage 22b fluidly connected to a distribution line 57 of the HVAC system 40 to be described below. The first passage 22a may be disposed on the downstream side of the battery warmer 23, and the coolant passing through the first passage 22a may release heat to a refrigerant passing through the second passage 22b so that the coolant may be cooled in the battery chiller 22, and the refrigerant may be heated or evaporated in the battery chiller 22. An outlet of the first passage 22a may communicate with the second battery-side port 32 of the control valve 30, and accordingly the coolant discharged from the first passage 22a may be directed to the second battery-side port 32 of the control valve 30.

The power electronics coolant line 12 may be fluidly connected to a power electronic pump 16. The power electronic components 25*a* and 25*b* and a heat exchanger 26 may be fluidly connected to the power electronics coolant line 12.

Each of the power electronic components 25*a* and 25*b* may have a coolant passage provided inside or outside thereof, and the coolant may pass through the coolant passage. The power electronics coolant line 12 may be fluidly connected to the coolant passage of the power electronic component.

The power electronic components 25*a* and 25*b* may be various components such as an autonomous driving controller, an integrated charging control unit, an inverter, and an electric motor. Referring to FIG. 1, the power electronic components 25*a* and 25*b* may include an electric motor 25*a*, and an inverter 25*b* controlling the electric motor 25*a*.

A heat sink temperature sensor 29 may be disposed on a heat sink 25*c* of any one of the power electronic components 25*a* and 25*b*. When the temperature of the heat sink 25*c* is kept constant (for example, the vehicle is traveling at a constant speed), the controller 100 may be configured to determine the temperature of the power electronics coolant line 12 based on a temperature of the heat sink 25*c* sensed by the heat sink temperature sensor 29.

In some examples, the inverter 25*b* may have the heat sink 25*c* attached to a circuit board thereof, the heat sink temperature sensor 29 may be disposed on the heat sink 25*c* of the inverter 25*b*, and the heat sink temperature sensor 29 may sense the temperature of the heat sink 25*c* of the inverter 25*b*. The power electronics coolant line 12 may be fluidly connected to the heat sink 25*c* of the inverter 25*b*.

When the vehicle is running at a constant speed, the temperature of the heat sink 25*c* sensed by the heat sink temperature sensor 29 may be kept constant or a variation in the temperature of the heat sink 25*c* may be less than a predetermined threshold (e.g., 2° C.). In this case, the temperature of the coolant passing through the power electronics coolant line 12 may be similar to the temperature of the heat sink 25*c* with an error of about 1° C. That is, when the temperature of the heat sink 25*c* is kept constant or the variation in the temperature of the heat sink 25*c* is less than the predetermined threshold (e.g., 2° C.), the temperature of the coolant passing through the power electronics coolant line 12 may be determined based on the temperature sensed by the heat sink temperature sensor 29.

For example, the controller 100 may determine the temperature sensed by the heat sink temperature sensor 29 as the temperature of the coolant passing through the power electronics coolant line 12, or may correct the temperature sensed by the heat sink temperature sensor 29 and determine the corrected temperature as the temperature of the coolant passing through the power electronics coolant line 12.

The power electronic pump 16 may be configured to allow the coolant to circulate, and an inlet of the power electronic pump 16 may communicate with the first power electronic-side port 33 of the control valve 30. Accordingly, the coolant discharged from the first power electronic-side port 33 of the control valve 30 may be sucked into the inlet of the power electronic pump 16. Referring to FIG. 1, the power electronic pump 16 may be disposed on the upstream side of the power electronic components 25*a* and 25*b*.

The heat exchanger 26 may be disposed on the upstream or downstream side of the power electronic components 25*a* and 25*b*, and the heat exchanger 26 may be configured to thermally connect the HVAC system 40 and the power electronics coolant line 12.

Referring to FIG. 1, the heat exchanger 26 may include a first passage 26*a* fluidly connected to the power electronics coolant line 12, and a second passage 26*b* fluidly connected to a third line 53 of the HVAC system 40 to be described below. The first passage 26*a* may be disposed on the downstream side of the power electronic components 25*a* and 25*b*, and the coolant passing through the first passage 26*a* may release heat to the refrigerant passing through the second passage 26*b* so that the coolant may be cooled in the heat exchanger 26, and the refrigerant may be heated or evaporated in the heat exchanger 26. An outlet of the first passage 26*a* may communicate with the second power electronic-side port 34 of the control valve 30, and accordingly the coolant discharged from the first passage 26*a* may be directed to the second power electronic-side port 34 of the control valve 30.

The radiator coolant line 13 may be configured to connect the control valve 30 and the radiator 27. The inlet of the radiator coolant line 13 may communicate with the first radiator-side port 35 of the control valve 30, and accordingly the coolant discharged from the first radiator-side port 35 of the control valve 30 may be directed to an inlet of the radiator 27. The outlet of the radiator coolant line 13 may communicate with the second radiator-side port 36 of the control valve 30, and accordingly the coolant discharged from an outlet of the radiator 27 may be directed to the second radiator-side port 36 of the control valve 30.

The radiator 27 may be disposed adjacent to a front grille 17 of the vehicle, and the radiator 27 may be configured to transfer heat between the coolant passing through an internal passage thereof and air passing by an exterior surface of the radiator 27.

The controller 100 may control the operation of the control valve 30 and the operation of an active air flap 18 based on temperatures of the power electronic components 52*a* and 52*b*, a temperature of the battery 21, an ambient temperature, operating conditions of the HVAC system 40, and the like. The controller 100 may estimate or predict the temperatures of the power electronic components 52*a* and 52*b* based on the temperature of the coolant passing through the power electronics coolant line 12. In particular, when the HVAC system 40 operates in a heating mode, the controller 100 may control the operation of the control valve 30 and the operation of the active air flap 18 based on the temperatures of the power electronic components 52*a* and 52*b*, which are main heat absorption sources, and the temperature of the coolant passing through the power electronics coolant line 12 so as to improve heating efficiency of the HVAC system 40.

The coolant system 10 may have a temperature sensor disposed in at least one of the battery coolant line 11, the power electronics coolant line 12, or the radiator coolant line 13. The controller 100 may be configured to control the control valve 30, the active air flap 18, a cooling fan 19, the battery pump 15, and the power electronic pump 16 based on a temperature sensed by the temperature sensor.

The controller 100 may control the switching operation(s) of the control valve 30 under predetermined condition(s) in a manner that fluidly connects a coolant line without any temperature sensor to a coolant line with the temperature sensor, and determine the temperature of the coolant passing through the coolant line without any temperature sensor based on the temperature sensed by the temperature sensor.

In some examples, as illustrated in FIG. 1, one temperature sensor 81 may be disposed in the battery coolant line 11, and no temperature sensor may be provided in the power electronics coolant line 12 and the radiator coolant line 13. In some examples, the temperature sensor 81 may be located between an outlet of the battery pump 15 and an inlet of the coolant passage of the battery 21 in the battery coolant line 11.

The controller 100 may control the switching operation of the control valve 30 under a predetermined condition in a manner that fluidly connects the power electronics coolant line 12 to the battery coolant line 11, and determine the temperature of the coolant passing through the power electronics coolant line 12 based on a temperature sensed by the temperature sensor 81.

The controller 100 may control the switching operation of the control valve 30 under a predetermined condition in a manner that fluidly connects the radiator coolant line 13 to the battery coolant line 11, and determine the temperature of the coolant passing through the radiator coolant line 13 based on the temperature sensed by the temperature sensor 81.

Figure 2:
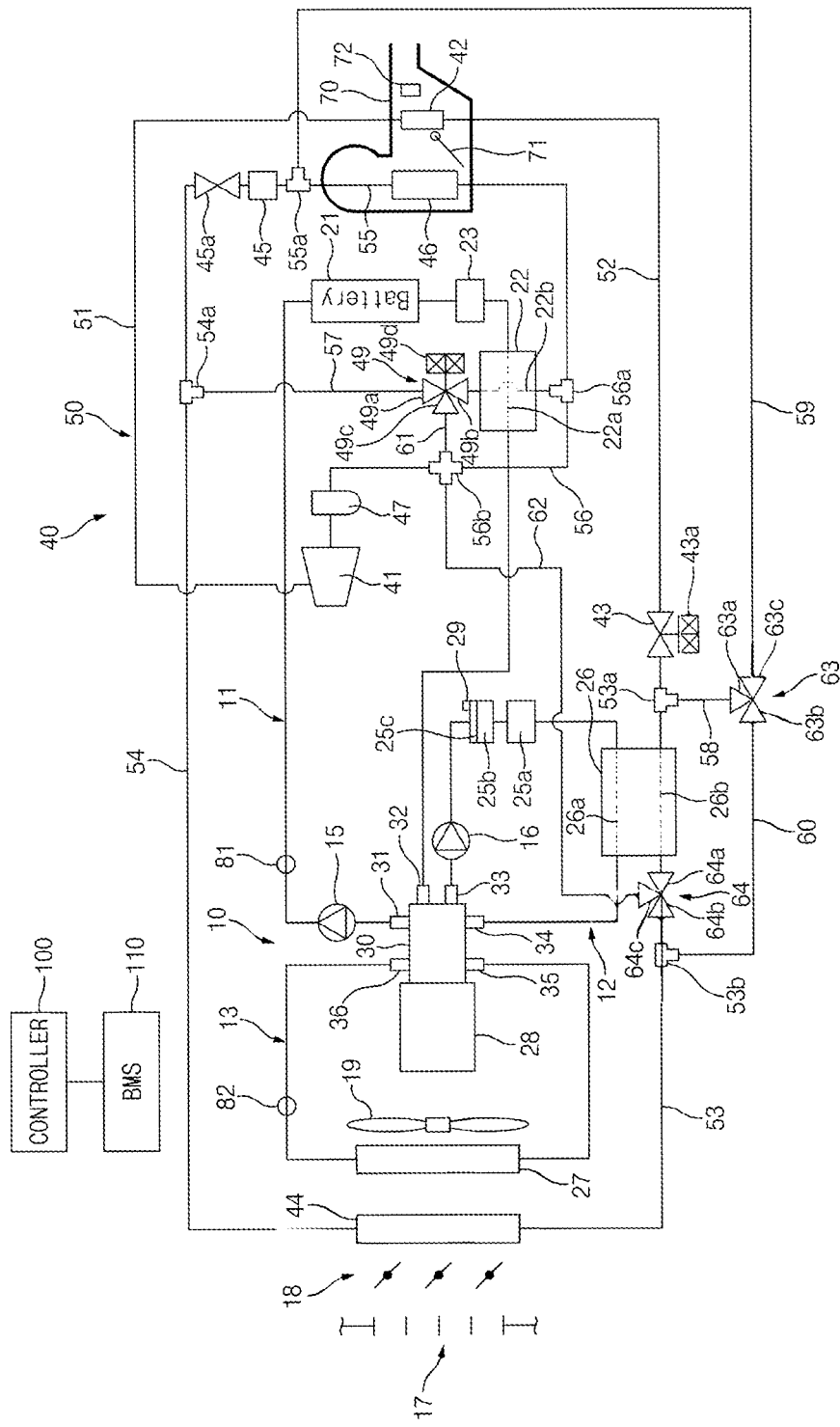
FIG. 2 illustrates an example of a vehicular thermal management system including a coolant system.

In some examples, as illustrated in FIG. 2, a first temperature sensor 81 may be disposed in the battery coolant line 11, and a second temperature sensor 82 may be disposed in the radiator coolant line 13. No temperature sensor may be provided in the power electronics coolant line 12. The controller 100 may be configured to control the control valve 30, the active air flap 18, the cooling fan 19, the battery pump 15, and the power electronic pump 16 based on a temperature of the coolant sensed by the first temperature sensor 81 or the second temperature sensor 82. In some examples, the first temperature sensor 81 may be located between the outlet of the battery pump 15 and the inlet of the coolant passage of the battery 21, and the second temperature sensor 82 may be located between the outlet of the radiator 27 and the second radiator-side port 36 of the control valve 30.

In some implementations, as illustrated in FIG. 2, the controller 100 may control the switching operation(s) of the control valve 30 under predetermined condition(s) in a manner that fluidly connects the power electronics coolant line 12 to the battery coolant line 11 and/or the radiator coolant line 13, and determine the temperature of the coolant passing through the power electronics coolant line 12 based on the temperature sensed by the first temperature sensor 81 or the second temperature sensor 82.

By various switching operations of the control valve 30, the coolant in the coolant system 10 may be allowed to selectively circulate in the battery coolant line 11, the power electronics coolant line 12, and/or the radiator coolant line 13 according to various circulation modes.

Figure 3:
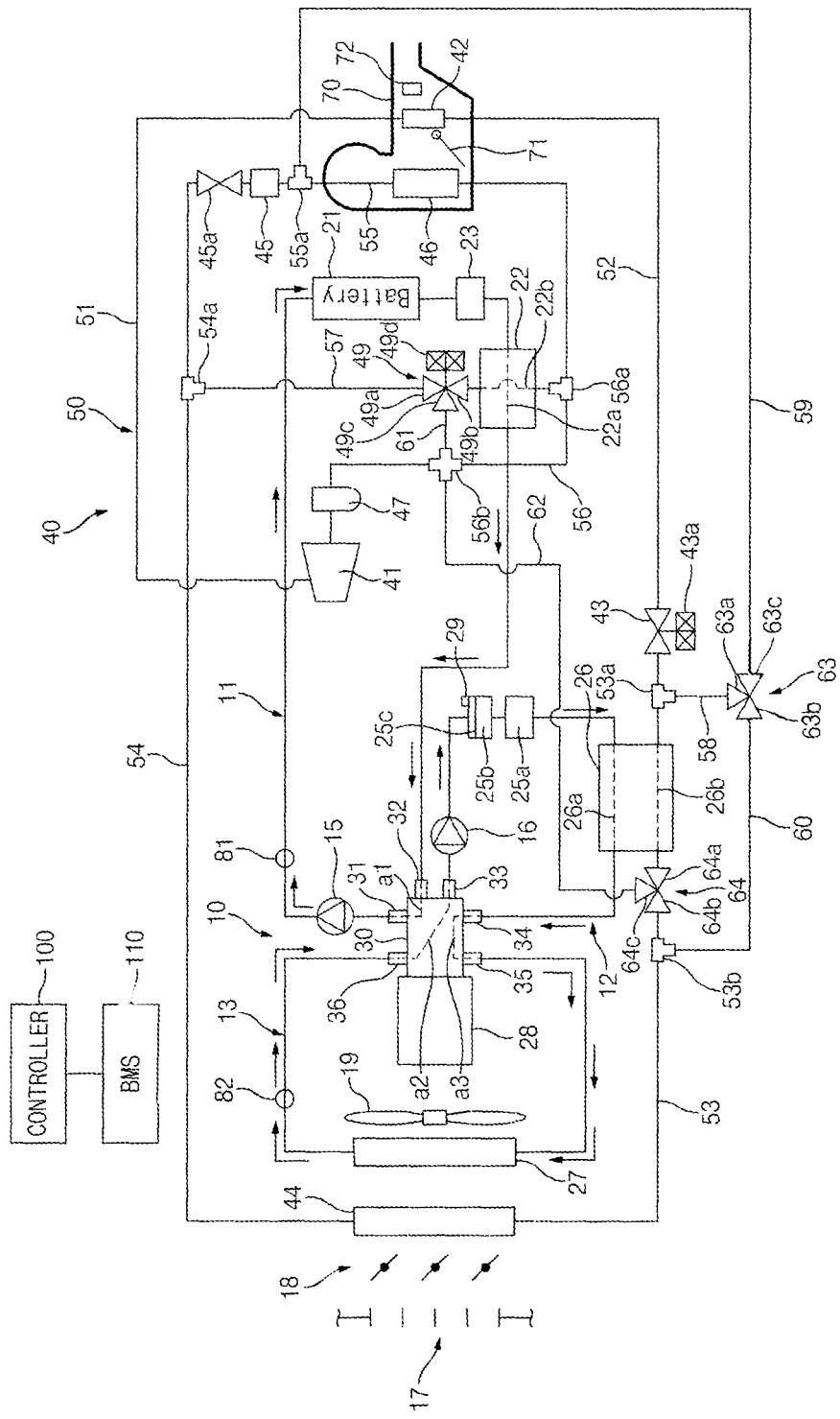
FIG. 3 illustrates an example of the flow of a coolant circulating in a first circulation mode by a first switching operation of a control valve in a coolant system.

FIG. 3 illustrates a state in which the coolant in the coolant system 10 circulates in a first circulation mode as the control valve 30 performs a first switching operation. The first circulation mode refers to a mode in which the battery coolant line 11 is fluidly separated from the power electronics coolant line 12 and the radiator coolant line 13, and the power electronics coolant line 12 is fluidly connected to the radiator coolant line 13.

Referring to FIG. 3, the control valve 30 may perform the first switching operation so that the first battery-side port 31 may communicate with the second battery-side port 32 (see a1), the first power electronic-side port 33 may communicate with the second radiator-side port 36 (see a2), and the second power electronic-side port 34 may communicate with the first radiator-side port 35 (see a3). Accordingly, the battery coolant line 11 may be fluidly separated from the power electronics coolant line 12 and the radiator coolant line 13, and the power electronics coolant line 12 may be fluidly connected to the radiator coolant line 13.

Referring to FIG. 3, a portion of the coolant may circulate in the battery coolant line 11. Specifically, a portion of the coolant may sequentially pass through the coolant passage of the battery 21, a coolant passage of the battery warmer 23, and the first passage 22a of the battery chiller 22 by the battery pump 15. A remaining portion of the coolant may circulate in the power electronics coolant line 12 and the radiator coolant line 13. Specifically, the remaining portion of the coolant may sequentially pass through the coolant passages of the power electronic components 25b and 25a, the first passage 26a of the heat exchanger 26, and the internal passage of the radiator 27 by the power electronic pump 16. Accordingly, a portion of the coolant may independently circulate through the battery coolant line 11, and the remaining portion of the coolant may independently circulate through the power electronics coolant line 12 and the radiator coolant line 13.

Figure 4:
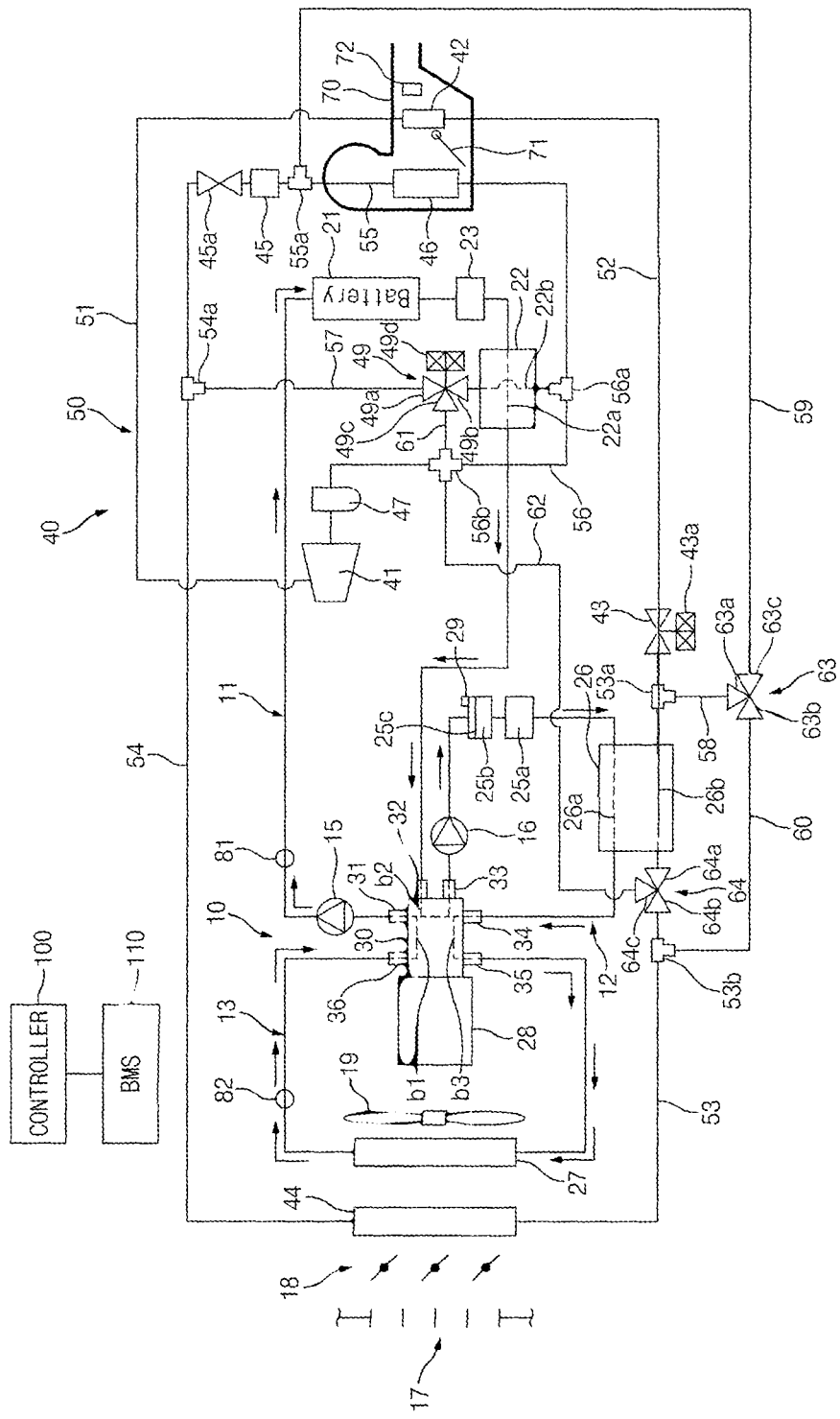
FIG. 4 illustrates an example of the flow of a coolant circulating in a second circulation mode by a second switching operation of a control valve in a coolant system.

FIG. 4 illustrates a state in which the coolant in the coolant system 10 circulates in a second circulation mode as the control valve 30 performs a second switching operation. The second circulation mode refers to a mode in which the radiator coolant line 13 is fluidly connected to the battery coolant line 11, the battery coolant line 11 is fluidly connected to the power electronics coolant line 12, and the power electronics coolant line 12 is fluidly connected to the radiator coolant line 13. That is, the second circulation mode refers to a mode in which the battery coolant line 11, the power electronics coolant line 12, and the radiator coolant line 13 are fluidly connected to each other.

Referring to FIG. 4, the control valve 30 may perform the second switching operation so that the first battery-side port 31 may communicate with the second radiator-side port 36 (see b1), the second battery-side port 32 may communicate with the first power electronic-side port 33 (see b2), and the second power electronic-side port 34 may communicate with the first radiator-side port 35 (see b3). Accordingly, the radiator coolant line 13 may be fluidly connected to the battery coolant line 11, the battery coolant line 11 may be fluidly connected to the power electronics coolant line 12, and the power electronics coolant line 12 may be fluidly connected to the radiator coolant line 13.

Referring to FIG. 4, the coolant may sequentially pass through the coolant passage of the battery 21, the coolant passage of the battery warmer 23, and the first passage 22a of the battery chiller 22 by the battery pump 15, and the coolant discharged from the first passage 22a of the battery chiller 22 may sequentially pass through the coolant passages of the power electronic components 25b and 25a, the first passage 26a of the heat exchanger 26, and the internal passage of the radiator 27 by the power electronic pump 16.

Figure 5:
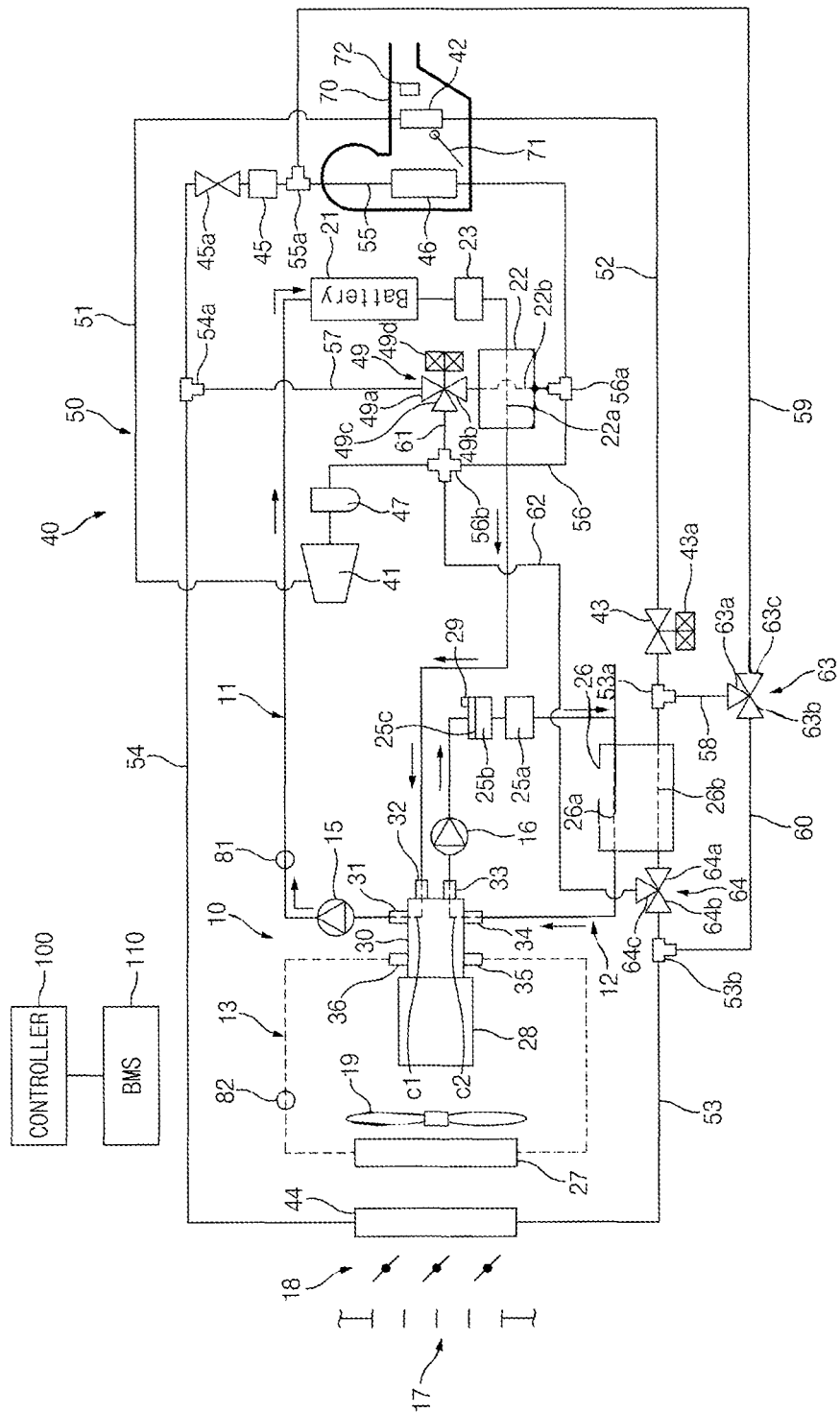
FIG. 5 illustrates an example of the flow of a coolant circulating in a third circulation mode by a third switching operation of a control valve in a coolant system.

FIG. 5 illustrates a state in which the coolant in the coolant system 10 circulates in a third circulation mode as the control valve 30 performs a third switching operation. The third circulation mode refers to a mode in which the radiator coolant line 13 is fluidly blocked from the control valve 30, and the battery coolant line 11 is fluidly separated from the power electronics coolant line 12.

Referring to FIG. 5, the control valve 30 may perform the third switching operation so that the first radiator-side port 35 and the second radiator-side port 36 may be closed, the first battery-side port 31 may communicate with the second battery-side port 32 (see c1), and the first power electronic-side port 33 may communicate with the second power electronic-side port 34 (see c2). Accordingly, the radiator coolant line 13 may be fluidly blocked from the control valve 30, and the battery coolant line 11 may be fluidly separated from the power electronics coolant line 12.

Referring to FIG. 5, a portion of the coolant may sequentially pass through the coolant passage of the battery 21, the coolant passage of the battery warmer 23, and the first passage 22a of the battery chiller 22 by the battery pump 15. A remaining portion of the coolant may sequentially pass through the coolant passages of the power electronic components 25b and 25a and the first passage 26a of the heat exchanger 26 by the power electronic pump 16. Accordingly, a portion of the coolant may independently circulate through the battery coolant line 11, and the remaining portion of the coolant may independently circulate through the power electronics coolant line 12.

Figure 6:
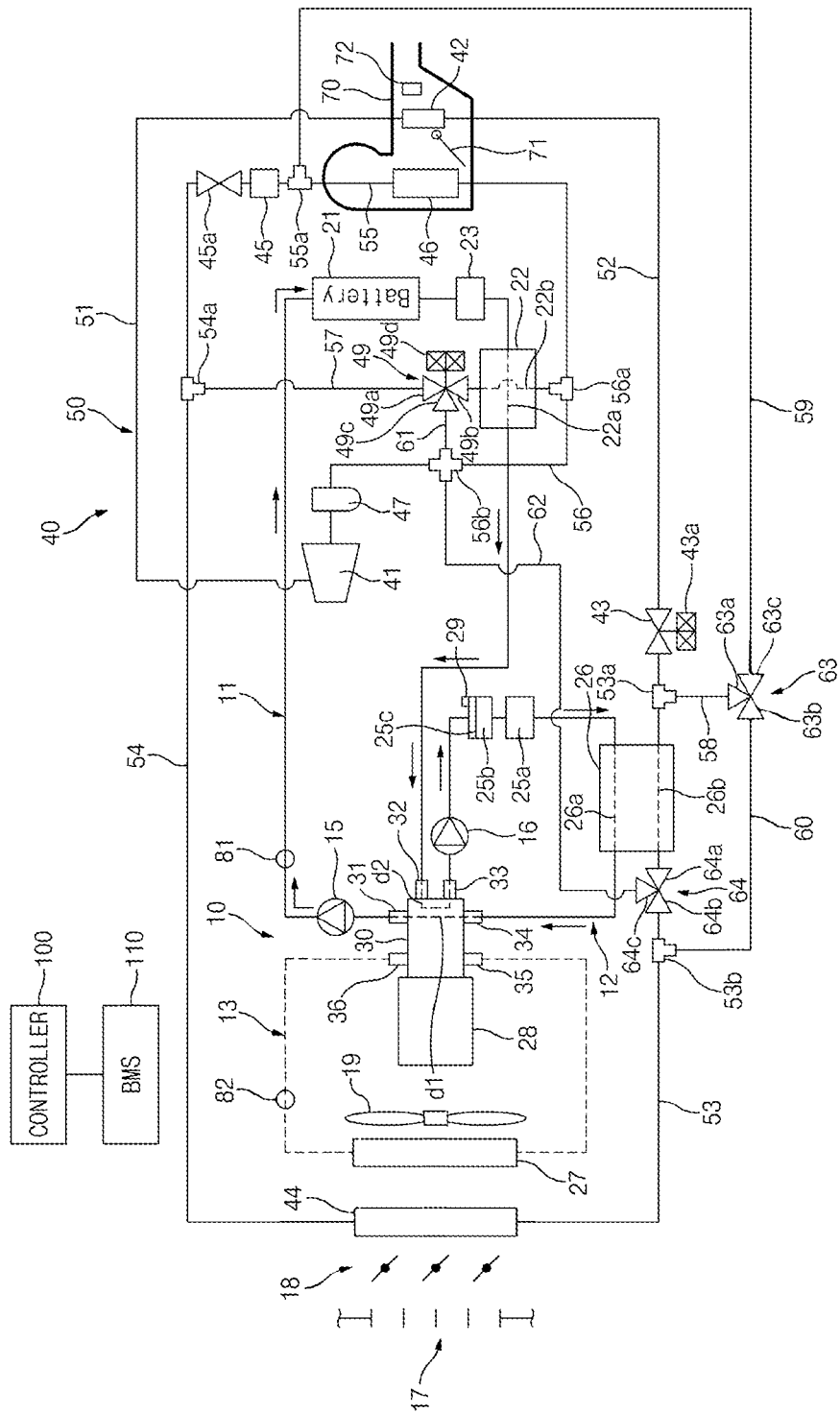
FIG. 6 illustrates an example of the flow of a coolant circulating in a fourth circulation mode by a fourth switching operation of a control valve in a coolant system.

FIG. 6 illustrates a state in which the coolant in the coolant system 10 circulates in a fourth circulation mode as the control valve 30 performs a fourth switching operation. The fourth circulation mode refers to a mode in which the radiator coolant line 13 is fluidly blocked from the control valve 30, and the battery coolant line 11 is fluidly connected to the power electronics coolant line 12.

Referring to FIG. 6, the control valve 30 may perform the fourth switching operation so that the first radiator-side port 35 and the second radiator-side port 36 may be closed, the first battery-side port 31 may communicate with the second power electronic-side port 34 (see d1), and the second battery-side port 32 may communicate with the first power electronic-side port 33 (see d2). Accordingly, the radiator coolant line 13 may be fluidly blocked from the control valve 30, and the battery coolant line 11 may be fluidly connected to the power electronics coolant line 12.

Referring to FIG. 6, the coolant may sequentially pass through the coolant passage of the battery 21, the coolant passage of the battery warmer 23, and the first passage 22a of the battery chiller 22 by the battery pump 15, and the coolant discharged from the first passage 22a of the battery chiller 22 may sequentially pass through the coolant passages of the power electronic components 25b and 25a and the first passage 26a of the heat exchanger 26 by the power electronic pump 16.

The HVAC system 40 may be thermally connected to a passenger compartment. In particular, the HVAC system 40 may be configured to heat or cool the air in the passenger compartment of the vehicle using a refrigerant.

A refrigerant circulation path 50 may be configured to provide various circulation paths based on various operating modes such as an operating mode of the HVAC system 40, cooling and warming-up of the battery 21, and cooling and warming-up of the power electronic components 25a and 25b.

The HVAC system 40 may include a compressor 41, an interior condenser 42, a heating-side expansion valve 43, an exterior heat exchanger 44, a cooling-side expansion valve 45, and an evaporator 46 fluidly connected through the refrigerant circulation path 50.

The compressor 41 may be configured to compress the refrigerant and allow the refrigerant to circulate. In some examples, the compressor 41 may be an electric compressor driven by electric energy.

The interior condenser 42 may be disposed on the downstream side of the compressor 41, and the interior condenser 42 may be configured to condense the refrigerant received from the compressor 41. That is, the refrigerant compressed by the compressor 41 may transfer heat to the air and be condensed in the interior condenser 42. Accordingly, the interior condenser 42 may heat the air using the refrigerant compressed by the compressor 41, and the air heated by the interior condenser 42 may be directed into the passenger compartment.

The heating-side expansion valve 43 may be disposed on the downstream side of the interior condenser 42 in the refrigerant circulation path 50. Specifically, the heating-side expansion valve 43 may be disposed between the interior condenser 42 and the exterior heat exchanger 44. During a heating operation of the HVAC system 40, the heating-side expansion valve 43 may adjust the flow of the refrigerant and/or the flow rate of the refrigerant into the exterior heat exchanger 44. The heating-side expansion valve 43 may be configured to expand the refrigerant received from the interior condenser 42 during the heating operation of the HVAC system 40. The opening degree of the heating-side expansion valve 43 may be varied by the controller 100. As the opening degree of the heating-side expansion valve 43 is varied, the flow rate of the refrigerant into the exterior heat exchanger 44 may be varied. That is, the heating-side expansion valve 43 may be controlled by the controller 100 during the heating operation of the HVAC system 40.

In some examples, the heating-side expansion valve 43 may be an electronic expansion valve (EXV) having an actuator 43a. The actuator 43a may have a shaft which is movable to open or close an orifice defined in a valve body of the heating-side expansion valve 43, and the position of the shaft may be varied depending on the rotation direction, rotation degree, and the like of the actuator 43a, and accordingly the opening degree of the orifice of the heating-side expansion valve 43 may be varied. The controller 100 may control the operation of the actuator 43a. The heating-side expansion valve 43 may be a full open type EXV. When the HVAC system 40 does not operate in the heating mode, the heating-side expansion valve 43 may be fully opened (the opening degree of the heating-side expansion valve 43 is 100%) so that the refrigerant may pass through the heating-side expansion valve 43, and thus the refrigerant may be prevented from being expanded by the heating-side expansion valve 43.

The exterior heat exchanger 44 together with the radiator 27 may be disposed adjacent to the front grille 17 of the vehicle. The exterior heat exchanger 44 may be configured to transfer heat between the coolant passing through an internal passage thereof and the air passing by an exterior surface of the exterior heat exchanger 44.

In some examples, the cooling fan 19 may be located behind the exterior heat exchanger 44 and the radiator 27, and the exterior heat exchanger 44 and the radiator 27 may exchange heat with the ambient air forcibly blown by the cooling fan 19 so that a heat transfer rate of the exterior heat exchanger 44 and the radiator 27 may be further increased.

In some examples, the active air flap 18 may be configured to adjust the opening degree of the front grille 17, and the active air flap 18 may be disposed between the front grille 17 and the exterior heat exchanger 44. Each flap of the active air flap 18 may be rotatably mounted to adjust the opening degree of a corresponding opening of the front grille 17. The controller 100 may monitor the vehicle speed and the opening degree of the front grille 17, receive the vehicle speed from a vehicle controller, and adjust the opening degree of the front grille 17 by the active air flap 18. The vehicle speed and the opening degree of the front grille 17 may be used to calculate the flow rate of air passing by the exterior surface of the exterior heat exchanger 44 and the exterior surface of the radiator 27.

During a cooling operation of the HVAC system 40, the exterior heat exchanger 44 may be configured to condense the refrigerant received from the interior condenser 42. That is, the refrigerant passing through the exterior heat exchanger 44 may serve as an exterior condenser that condenses the refrigerant by transferring heat to the ambient air during the cooling operation of the HVAC system 40. During the heating operation of the HVAC system 40, the exterior heat exchanger 44 may be configured to evaporate the refrigerant expanded by the heating-side expansion valve 43. That is, the refrigerant passing through the exterior heat exchanger 44 may serve as an exterior evaporator that evaporates the refrigerant by absorbing heat from the ambient air during the heating operation of the HVAC system 40. In particular, the exterior heat exchanger 44 may exchange heat with the ambient air forcibly blown by the cooling fan 19 so that a heat transfer rate between the exterior heat exchanger 44 and the ambient air may be further increased.

The cooling-side expansion valve 45 may be disposed on the downstream side of the exterior heat exchanger 44 in the refrigerant circulation path 50, and the cooling-side expansion valve 45 may be disposed between the exterior heat exchanger 44 and the evaporator 46 in the refrigerant circulation path 50. The cooling-side expansion valve 45 may be disposed on the upstream side of the evaporator 46 so that it may adjust the flow of the refrigerant and/or the flow rate of the refrigerant into the evaporator 46. During the cooling operation of the HVAC system 40, the cooling-side expansion valve 45 may be configured to expand the refrigerant received from the exterior heat exchanger 44.

In some examples, the cooling-side expansion valve 45 may be a thermal expansion valve (TXV) which senses the temperature and/or pressure of the refrigerant and adjusts the opening degree of the cooling-side expansion valve 45. Specifically, the cooling-side expansion valve 45 may be a TXV having a solenoid valve 45a selectively blocking or unblocking the flow of the refrigerant into an internal passage of the cooling-side expansion valve 45. The solenoid valve 45a may be opened or closed by the controller 100, thereby unblocking or blocking the flow of the refrigerant into the cooling-side expansion valve 45. When the solenoid valve 45a is opened, the refrigerant may be allowed to flow into the cooling-side expansion valve 45, and when the solenoid valve 45a is closed, the refrigerant may be blocked from flowing into the cooling-side expansion valve 45. In some examples, the solenoid valve 45a may be integrally formed in a valve body of the cooling-side expansion valve 45 to thereby open or close the internal passage of the cooling-side expansion valve 45. In some examples, the solenoid valve 45a may be disposed on the upstream side of the cooling-side expansion valve 45 to thereby selectively open or close an inlet of the cooling-side expansion valve 45. When the solenoid valve 45a is closed, the refrigerant may be blocked from flowing into the cooling-side expansion valve 45 and the evaporator 46, and accordingly the cooling operation of the HVAC system 40 may not be performed. When the solenoid valve 45a is opened, the refrigerant may be directed to the cooling-side expansion valve 45 and the evaporator 46. That is, when the solenoid valve 45a of the cooling-side expansion valve 45 is opened to a predetermined degree, the cooling operation of the HVAC system 40 may be performed.

The HVAC system 40 may include an HVAC case 70 including a blower blowing the heated air or cooled air into the passenger compartment. The HVAC case 70 may have an inlet and an outlet, and the HVAC case 70 may be configured to allow the air to be directed into the passenger compartment of the vehicle. The evaporator 46 and the interior condenser 42 may be located in the HVAC case 70. An air mixing door 71 may be disposed between the evaporator 46 and the interior condenser 42, and an electric heater 72 such as a PTC (positive temperature coefficient) heater may be disposed on the downstream side of the interior condenser 42 in an air flow direction.

The evaporator 46 may be configured to evaporate the refrigerant, thereby cooling the air directed toward the passenger compartment, and the interior condenser 42 may be configured to condense the refrigerant, thereby heating the air directed toward the passenger compartment. The electric heater 72 may be configured to heat the air directed toward the passenger compartment using electric energy.

The air mixing door 71 may be disposed between the evaporator 46 and the interior condenser 42. As the position of the air mixing door 71 changes, the flow rate of the air cooled by the evaporator 46 and the flow rate of the air heated by the interior condenser 42 may be mixed at a predetermined ratio. The air cooled by the evaporator 46, the air heated by the interior condenser 42, and the air mixed by the air mixing door 71 in the HVAC case 70 may be directed toward a front seat area of the passenger compartment through an air distributer unit.

The HVAC system 40 may further include an accumulator 47 located on the upstream side of the compressor 41. The accumulator 47 may separate a liquid refrigerant from the refrigerant, thereby preventing the liquid refrigerant from flowing into the compressor 41.

The refrigerant circulation path 50 may include a first line 51 extending from an outlet of the compressor 41 to the interior condenser 42, a second line 52 extending from the interior condenser 42 to the heating-side expansion valve 43, a third line 53 extending from the heating-side expansion valve 43 to the exterior heat exchanger 44, a fourth line 54 extending from the exterior heat exchanger 44 to the cooling-side expansion valve 45, a fifth line 55 extending from the cooling-side expansion valve 45 to the evaporator 46, and a sixth line 56 extending from the evaporator 46 to the compressor 41.

The HVAC system 40 may further include the distribution line 57 configured to allow at least a portion of the refrigerant discharged from the exterior heat exchanger 44 to be directed from the upstream side of the cooling-side expansion valve 45 to the compressor 41. The distribution line 57 may be configured to connect an upstream point 54a of the cooling-side expansion valve 45 and an upstream point of the compressor 41. An inlet of the distribution line 57 may be connected to the fourth line 54 of the refrigerant circulation path 50 at the upstream point 54a of the cooling-side expansion valve 45. An outlet of the distribution line 57 may be connected to the refrigerant circulation path 50 at the upstream point of the compressor 41. Specifically, the outlet of the distribution line 57 may be connected to the sixth line 56 of the refrigerant circulation path 50 at an upstream point 56a of the accumulator 47 located on the upstream side of the compressor 41. Accordingly, at least a portion of the refrigerant may be directed to the compressor 41 through the distribution line 57.

The distribution line 57 may be configured to allow at least a portion of the refrigerant discharged from the exterior heat exchanger 44 to be directed toward the compressor 41 by bypassing the cooling-side expansion valve 45 and the evaporator 46. Accordingly, the refrigerant may be distributed to the distribution line 57 and the fifth line 55 at a predetermined ratio. The second passage 22b of the battery chiller 22 may be fluidly connected to the distribution line 57, and the refrigerant passing through the second passage 22b of the battery chiller 22 may absorb heat from the coolant passing through the first passage 22a of the battery chiller 22 (heat absorption) so that the refrigerant may be heated or evaporated in the battery chiller 22, and the coolant may be cooled in the battery chiller 22.

The HVAC system 40 may further include a bypass line 61 configured to allow at least a portion of the refrigerant passing through the distribution line 57 to be directed from the upstream side of the second passage 22b of the battery chiller 22 to the downstream side of the second passage 22b of the battery chiller 22. The bypass line 61 may be configured to connect an upstream point of the second passage 22b of the battery chiller 22 and an upstream point 56b of the compressor 41. An inlet of the bypass line 61 may be connected to the distribution line 57 at the upstream point of the second passage 22b of the battery chiller 22, and an outlet of the bypass line 61 may be connected to the sixth line 56 of the refrigerant circulation path 50 at the upstream point 56b of the compressor 41. Accordingly, a portion of the refrigerant passing through the distribution line 57 may bypass the second passage 22b of the battery chiller 22 through the bypass line 61 so that it may be directed to the compressor 41.

The HVAC system 40 may further include a battery-side expansion valve 49 located on the upstream side of the battery chiller 22 in the distribution line 57.

The battery-side expansion valve 49 may be configured to adjust the flow of the refrigerant and/or the flow rate of the refrigerant into the second passage 22b of the battery chiller 22, and to expand the refrigerant received from the exterior heat exchanger 44. In some examples, the battery-side expansion valve 49 may be an EXV having an actuator 49d. The controller 100 may control the operation of the actuator 49d.

The battery-side expansion valve 49 may include an inlet port 49a communicating with the exterior heat exchanger 44, and an outlet port 49b communicating with the second passage 22b of the battery chiller 22. The battery-side expansion valve 49 may include a valve housing, and a valve member moved by the actuator 49d in the valve housing.

The valve member may be configured to open or close the inlet port 49a by the actuator 49d. When the inlet port 49a is opened, the inlet port 49a may receive the refrigerant discharged from the exterior heat exchanger 44.

The valve member may be configured to adjust the opening degree of the outlet port 49b by the actuator 49d. When the temperature of the battery exceeds a threshold temperature (that is, waste heat of the battery is relatively high, so the cooling of the battery is provided), the opening degree of the outlet port 49b may be adjusted by the valve member and the actuator 49d to correspond to a cooling load of the battery 21 so that the refrigerant may be expanded at the outlet port 49b, and the flow rate of the refrigerant into the second passage 22b of the battery chiller 22 may be adjusted, and accordingly the expanded refrigerant may be directed to the second passage 22b of the battery chiller 22. The refrigerant passing through the second passage 22b of the battery chiller 22 may directly absorb heat from the coolant passing through the first passage 22a of the battery chiller 22 so that the refrigerant may be evaporated in the second passage 22b of the battery chiller 22. When the cooling of the battery 21 is provided, the opening degree of the outlet port 49b may be adjusted so that the outlet port 49b may serve as an expansion valve that expands the refrigerant flowing into the second passage 22b of the battery chiller 22.

In some examples of the present disclosure, the battery-side expansion valve 49 may further include a bypass port 49c communicating with the inlet of the bypass line 61, and the valve member may be configured to adjust the opening degree of the bypass port 49c by the actuator 49d. When the bypass port 49c is opened, the refrigerant discharged from the bypass port 49c may be directed to the compressor 41 through the bypass line 61.

The bypass port 49c may be directly connected to the bypass line 61, and the opening degree of the bypass port 49c may be adjusted by the actuator 49d so that the flow rate of the refrigerant into the bypass line 61 may be adjusted. The bypass port 49c may serve as a flow control valve that adjusts the flow rate of the refrigerant bypassing the second passage 22b of the battery chiller 22.

The opening degree of the outlet port 49b and the opening degree of the bypass port 49c may be adjusted depending on the temperature of the battery, and accordingly the flow rate of the refrigerant into the second passage 22b of the battery chiller 22 and the flow rate of the refrigerant passing through the bypass line 61 may be adjusted at a predetermined ratio. For example, when the temperature of the battery is lower than or equal to a threshold temperature (that is, the waste heat of the battery is relatively reduced), the opening degree of the outlet port 49b may be relatively reduced, and the opening degree of the bypass port 49c may be relatively increased so that the flow rate of the refrigerant into the second passage 22b of the battery chiller 22 may be lower than the flow rate of the refrigerant passing through the bypass line 61.

The second passage 26b of the heat exchanger 26 may be fluidly connected to the third line 53 of the refrigerant circulation path 50 of the HVAC system 40. Accordingly, at least a portion of the refrigerant may pass through the second passage 26b of the heat exchanger 26 through the third line 53 of the refrigerant circulation path 50. That is, the second passage 26b may be fluidly connected to the refrigerant circulation path 50 between the heating-side expansion valve 43 and the exterior heat exchanger 44.

When the HVAC system 40 performs the heating operation, the refrigerant may be expanded by the heating-side expansion valve 43 and then pass through the second passage 26b of the heat exchanger 26, and the refrigerant passing through the second passage 26b may absorb heat from the coolant passing through the first passage 26a of the heat exchanger 26 so that the refrigerant may be evaporated in the heat exchanger 26, and the coolant may be cooled in the heat exchanger 26. That is, the heat exchanger 26 may serve as an evaporator that evaporates the refrigerant during the heating operation of the HVAC system 40.

When the HVAC system 40 performs the cooling operation, the heating-side expansion valve 43 may be fully opened so that the refrigerant may not be expanded in the heating-side expansion valve 43, and the refrigerant passing through the second passage 26b of the heat exchanger 26 may release heat to the coolant passing through the first passage 26a of the heat exchanger 26 (heat release) so that the refrigerant may be condensed in the heat exchanger 26, and the coolant may be heated in the heat exchanger 26. That is, the heat exchanger 26 may serve as a condenser that condenses the refrigerant during the cooling operation of the HVAC system 40.

The HVAC system 40 may further include a dehumidification bypass line 59 configured to allow the refrigerant discharged from the heating-side expansion valve 43 to be directed from the upstream side of the second passage 26b of the heat exchanger 26 to the evaporator 46. The dehumidification bypass line 59 may be configured to connect a downstream point 53a of the heating-side expansion valve 43 and an upstream point 55a of the evaporator 46. Specifically, the branch line 58 may be branched from a point between the heating-side expansion valve 43 and the second passage 26b of the heat exchanger 26, an inlet of the dehumidification bypass line 59 may be connected to the branch line 58, and an outlet of the dehumidification bypass line 59 may be connected to the fifth line 55 of the refrigerant circulation path 50 at the upstream point 55a of the evaporator 46.

The HVAC system 40 may further include a heat exchanger bypass line 60 configured to allow at least a portion of the refrigerant discharged from the heating-side expansion valve 43 to bypass the second passage 26b of the heat exchanger 26 and be directed to the downstream side of the second passage 26b of the heat exchanger 26. The heat exchanger bypass line 60 may be configured to connect an upstream point of the second passage 26b of the heat exchanger 26 and a downstream point 53b of the second passage 26b of the heat exchanger 26. Specifically, an inlet of the heat exchanger bypass line 60 may be connected to the branch line 58, and an outlet of the heat exchanger bypass line 60 may be connected to the third line 53 of the refrigerant circulation path 50 at the downstream point 53b of the second passage 26b of the heat exchanger 26. Accordingly, the refrigerant discharged from the heating-side expansion valve 43 may be directed from the upstream point of the second passage 26b of the heat exchanger 26 to the downstream point of the second passage 26b of the heat exchanger 26 through the branch line 58 and the heat exchanger bypass line 60 so that at least a portion of the refrigerant discharged from the heating-side expansion valve 43 may bypass the second passage 26b of the heat exchanger 26.

The HVAC system 40 may further include a first control valve 63 disposed at a point to which the branch line 58, the dehumidification bypass line 59, and the heat exchanger bypass line 60 are connected. The first control valve 63 may be configured to control the flow of the refrigerant (the flow direction of the refrigerant, the flow rate of the refrigerant, and the like) between the heating-side expansion valve 43, the evaporator 46, and the exterior heat exchanger 44. The first control valve 63 may be configured to control the flow of the refrigerant in a manner that allows the refrigerant discharged from the heating-side expansion valve 43 to be selectively directed toward at least one of the evaporator 46, the second passage 26b of the heat exchanger 26, or the downstream point 53b of the second passage 26b of the heat exchanger 26.

The first control valve 63 may include an inlet port 63a communicating with the branch line 58, a first outlet port 63b communicating with the heat exchanger bypass line 60, and a second outlet port 63c communicating with the dehumidification bypass line 59.

In a state in which the first control valve 63 performs a first switching operation to allow the inlet port 63a to be discharged from the heating-side closed, the refrigerant expansion valve 43 may be directed to the second passage 26b of the heat exchanger 26.

In a state in which the first control valve 63 performs a second switching operation to allow the inlet port 63a to communicate with the first outlet port 63b, the refrigerant discharged from the heating-side expansion valve 43 may be directed to the downstream point 53b of the second passage 26b of the heat exchanger 26 through the heat exchanger bypass line 60. In addition, the refrigerant may be directed from the downstream point 53b of the second passage 26b of the heat exchanger 26 to the exterior heat exchanger 44.

In a state in which the first control valve 63 performs a third switching operation to allow the inlet port 63a to communicate with the second outlet port 63c, the refrigerant discharged from the heating-side expansion valve 43 may be directed to the evaporator 46 through the dehumidification bypass line 59. When dehumidification is provided in the passenger compartment during the heating operation of the HVAC system 40, the first control valve 63 may perform the third switching operation so that at least a portion of the refrigerant discharged from the heating-side expansion valve 43 may be directed to the evaporator 46 through the dehumidification bypass line 59. Accordingly, the refrigerant directed to the evaporator 46 may cool the air passing by an exterior surface of the evaporator 46 so that the dehumidification of the air flowing into the passenger compartment may be performed.

The HVAC system 40 may further include a heating bypass line 62 configured to allow the refrigerant discharged from the second passage 26b of the heat exchanger 26 to be directed to the compressor 41. The heating bypass line 62 may be configured to connect a downstream point of the second passage 26b of the heat exchanger 26 and the upstream point 56b of the compressor 41. Specifically, an inlet of the heating bypass line 62 may be connected to the third line 53 of the refrigerant circulation path 50 at the downstream point of the second passage 26b of the heat exchanger 26, and an outlet of the heating bypass line 62 may be connected to the sixth line 56 of the refrigerant circulation path 50 at the upstream point 56b of the compressor 41. Accordingly, the refrigerant discharged from the second passage 26b of the heat exchanger 26 may bypass the exterior heat exchanger 44, the battery-side expansion valve 49, and the second passage 22b of the battery chiller 22 through the heating bypass line 62 so that the refrigerant may be directed from the second passage 26b of the heat exchanger 26 to the compressor 41.

The HVAC system 40 may further include a second control valve 64 disposed at a point to which the heating bypass line 62 and the third line 53 of the refrigerant circulation path 50 are connected. The second control valve 64 may be configured to control the flow of the refrigerant (the flow direction of the refrigerant, the flow rate of the refrigerant, and the like) between the second passage 26b of the heat exchanger 26, the exterior heat exchanger 44, and the compressor 41. The second control valve 64 may be configured to control the flow of the refrigerant in a manner that allows the refrigerant discharged from the second passage 26b of the heat exchanger 26 to be selectively directed toward the exterior heat exchanger 44 and/or the compressor 41.

The second control valve 64 may include an inlet port 64a communicating with the second passage 26b of the heat exchanger 26, a first outlet port 64b communicating with the exterior heat exchanger 44, and a second outlet port 64c communicating with the heating bypass line 62.

In a state in which the second control valve 64 performs a first switching operation to allow the inlet port 64a to communicate with the first outlet port 64b, the refrigerant discharged from the second passage 26b of the heat exchanger 26 may be directed to the exterior heat exchanger 44.

In a state in which the second control valve 64 performs a second switching operation to allow the inlet port 64a to communicate with the second outlet port 64c, the refrigerant discharged from the second passage 26b of the heat exchanger 26 may be directed to the compressor 41 through the heating bypass line 62.

The controller 100 may be configured to control respective operations of the compressor 41, the actuator 43a of the heating-side expansion valve 43, the solenoid valve 45a of the cooling-side expansion valve 45, the actuator 49d of the battery-side expansion valve 49, the air mixing door 71, an actuator of the first control valve 63, an actuator of the second control valve 64, the battery warmer 23, an actuator of the cooling fan 19, the electric heater 72, an actuator of the air mixing door 71, an actuator of the control valve 30, an actuator of the battery pump 15, and an actuator of the power electronic pump 16. Thus, the overall operation of the coolant system 10 and the HVAC system 40 may be controlled by the controller 100. In some examples, the controller 100 may be a full automatic temperature control (FATC) system.

The controller 100 may include a processor and a memory. The processor may be programmed to receive instructions stored in the memory, and transmit instructions to various actuators. The memory may be a data store such as a hard disk drive, a solid state drive, a server, a volatile storage medium, and a non-volatile storage medium.

A battery management system 110 may transmit instructions for the cooling of the battery 21 and the warming-up of the battery 21 to the controller 100, and accordingly the controller 100 may control the operation of the compressor 41 and the operation of the actuator 49d of battery-side expansion valve 49.

The coolant system 10 in FIG. 1 may include one temperature sensor 81 disposed in the battery coolant line 11. When the coolant system 10 operates in the first circulation mode or the third circulation mode, the power electronics coolant line 12 may be fluidly separated from the battery coolant line 11 and/or the radiator coolant line 13. In this state, when the temperature of the heat sink 25c sensed by the heat sink temperature sensor 29 is kept constant or a variation in the temperature of the heat sink 25c sensed by the heat sink temperature sensor 29 is less than a predetermined threshold (e.g., 2° C.) (that is, the vehicle is traveling at a constant speed), the controller 100 may determine the temperature of the coolant passing through the power electronics coolant line 12 based on the temperature of the heat sink sensed by the heat sink temperature sensor 29.

While the vehicle is accelerating or decelerating, the vehicle speed may rapidly change or the torque of the electric motor 25a may rapidly change, and accordingly a variation in the temperature of the heat sink 25c sensed by the heat sink temperature sensor 29 may be greater than or equal to a predetermined threshold (e.g., 2° C.) for a predetermined period of time (e.g., five seconds). In this case, the temperature of the coolant passing through the power electronics coolant line 12 may considerably differ from the temperature of the heat sink 25c. When the variation in the temperature of the heat sink 25c is greater than or equal to the predetermined threshold (e.g., 2° C.) for a predetermined period of time (e.g., five seconds), the temperature of the coolant passing through the power electronics coolant line 12 may not be determined based on the temperature sensed by the heat sink temperature sensor 29.

In a state in which the coolant system 10 including one temperature sensor 81 disposed in the battery coolant line 11 operates in the first circulation mode (see FIG. 3), the power electronics coolant line 12 may be fluidly separated from the battery coolant line 11, and the power electronics coolant line 12 may be fluidly connected to the radiator coolant line 13. When a variation in the temperature of the heat sink 25c is greater than or equal to a predetermined threshold (e.g., 2° C.) for a predetermined period of time (e.g., five seconds), the control valve 30 may perform the second switching operation so that the coolant system 10 may switch from the first circulation mode to the second circulation mode (see FIG. 4) for a predetermined period of time (e.g., ten seconds), and each of the battery pump 15 and the power electronic pump 16 may operate at maximum RPM. Accordingly, the coolant passing through the power electronics coolant line 12 may pass through the battery coolant line 11. As a result, the temperature of the coolant passing through the power electronics coolant line 12 may become similar to a temperature sensed by the temperature sensor 81 disposed in the battery coolant line 11, and the controller 100 may determine the temperature of the coolant passing through the power electronics coolant line 12 based on the temperature sensed by the temperature sensor 81 disposed in the battery coolant line 11.

In a state in which the coolant system 10 including one temperature sensor 81 disposed in the battery coolant line 11 operates in the third circulation mode (see FIG. 5), the power electronics coolant line 12 may be fluidly separated from the battery coolant line 11, and the radiator coolant line 13 may be fluidly blocked from the control valve 30. When a variation in the temperature of the heat sink 25c sensed by the heat sink temperature sensor 29 is greater than or equal to a predetermined threshold (e.g., 2° C.) for a predetermined period of time (e.g., five seconds), the control valve 30 may perform the fourth switching operation so that the coolant system 10 may switch from the third circulation mode to the fourth circulation mode (see FIG. 6) for a predetermined period of time (e.g., ten seconds), and each of the battery pump 15 and the power electronic pump 16 may operate at maximum RPM. Accordingly, the coolant passing through the power electronics coolant line 12 may pass through the battery coolant line 11. As a result, the temperature of the coolant passing through the power electronics coolant line 12 may become similar to a temperature sensed by the temperature sensor 81 disposed in the battery coolant line 11, and the controller 100 may determine the temperature of the coolant passing through the power electronics coolant line 12 based on the temperature sensed by the temperature sensor 81 disposed in the battery coolant line 11.

Figure 7:
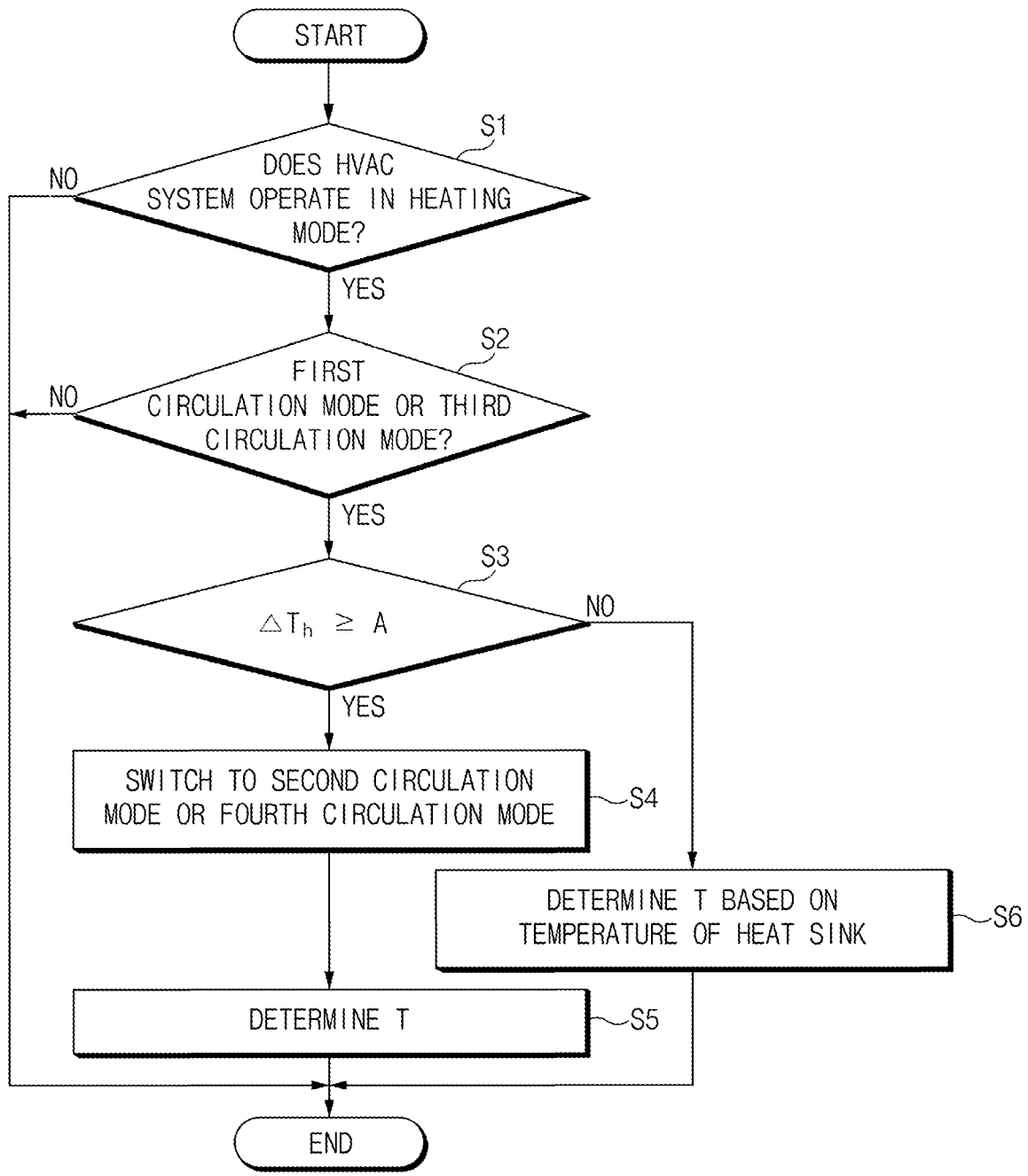
FIG. 7 illustrates an example of a flowchart of a method of controlling a coolant system.

FIG. 7 illustrates a method of controlling the coolant system 10 in FIG. 1.

The controller 100 may determine whether the HVAC system 40 operates in the heating mode (S1).

When it is determined that the HVAC system 40 operates in the heating mode, the controller 100 may determine whether the coolant system 10 operates in the first circulation mode or the third circulation mode (S2).

In the first circulation mode, the power electronics coolant line 12 may be fluidly separated from the battery coolant line 11, and the power electronics coolant line 12 may be fluidly connected to the radiator coolant line 13. In the third circulation mode, the power electronics coolant line 12 may be fluidly separated from the battery coolant line 11, and the radiator coolant line 13 may be fluidly blocked from the control valve 30. That is, when the coolant system 10 operates in the first circulation mode or the third circulation mode, the power electronics coolant line 12 may be fluidly separated from the battery coolant line 11.

When it is determined that the coolant system 10 operates in the first circulation mode or the third circulation mode, the controller 100 may determine whether a variation $\Delta T_h$ in temperature of the heat sink 25c sensed by the heat sink temperature sensor 29 is greater than or equal to a predetermined threshold A (e.g., 2° C.) for a predetermined period of time (e.g., five seconds) (S3). While the vehicle is running at a constant speed, the temperature of the heat sink 25c sensed by the heat sink temperature sensor 29 may be kept constant or the variation in the temperature of the heat sink 25c may be less than the predetermined threshold. While the vehicle is accelerating or decelerating, the vehicle speed may rapidly change or the torque of the electric motor 25a may rapidly change, and accordingly the variation in the temperature of the heat sink 25c sensed by the heat sink temperature sensor 29 may be greater than or equal to the predetermined threshold for a predetermined period of time.

When it is determined that the variation $\Delta T_h$ in the temperature of the heat sink 25c is greater than or equal to the predetermined threshold A (e.g., 2° C.) for a predetermined period of time (e.g., five seconds), the controller 100 may control the switching operation of the control valve 30 so that the coolant system 10 may switch to the second circulation mode or the fourth circulation mode for a predetermined period of time (e.g., ten seconds) (S4). Here, the controller 100 may control the battery pump 15 and the power electronic pump 16 in a manner that operates the battery pump 15 and the power electronic pump 16 at maximum RPM. As the battery pump 15 and the power electronic pump 16 operate at maximum RPM, thermal equilibrium may be quickly achieved between the temperature of the coolant passing through the battery coolant line 11 and the temperature of the coolant passing through the power electronics coolant line 12.

In some examples, when it is determined that the variation $\Delta T_h$ in the temperature of the heat sink 25c is greater than or equal to the predetermined threshold A for a predetermined period of time in a state in which the coolant system 10 operates in the first circulation mode, the controller 100 may control the control valve 30 in a manner that switches the operating mode of the coolant system 10 from the first circulation mode to the second circulation mode.

In some examples, when it is determined that the variation $\Delta T_h$ in the temperature of the heat sink 25c is greater than or equal to the predetermined threshold A for a predetermined period of time in a state in which the coolant system 10 operates in the third circulation mode, the controller 100 may control the control valve 30 in a manner that switches the operating mode of the coolant system 10 from the third circulation mode to the fourth circulation mode.

In a state in which the coolant system 10 switches to the second circulation mode or the fourth circulation mode for a predetermined period of time, the controller 100 may determine a temperature T of the coolant passing through the power electronics coolant line 12 based on a temperature sensed by the temperature sensor 81 (S5).

When it is determined that the variation $\Delta T_h$ in the temperature of the heat sink 25c is less than the predetermined threshold A (e.g., 2° C.) for a predetermined period of time (e.g., five seconds), the controller 100 may determine the temperature T of the coolant passing through the power electronics coolant line 12 based on a temperature of the heat sink sensed by the heat sink temperature sensor 29 (S6).

The coolant system 10 in FIG. 2 may include the first temperature sensor 81 disposed in the battery coolant line 11 and the second temperature sensor 82 disposed in the radiator coolant line 13. When the coolant system 10 operates in the third circulation mode, the power electronics coolant line 12 may be fluidly separated from the battery coolant line 11 and the radiator coolant line 13. In this state, when the temperature of the heat sink sensed by the heat sink temperature sensor 29 is kept constant or a variation in the temperature of the heat sink sensed by the heat sink temperature sensor 29 is less than a predetermined threshold (e.g., 2° C.) (that is, the vehicle is running at a constant speed), the controller 100 may determine the temperature of the coolant passing through the power electronics coolant line 12 based on the temperature of the heat sink sensed by the heat sink temperature sensor 29.

While the vehicle is accelerating or decelerating, the vehicle speed may rapidly change or the torque of the electric motor 25a may rapidly change, and accordingly a variation in the temperature of the heat sink 25c sensed by the heat sink temperature sensor 29 may be greater than or equal to a predetermined threshold (e.g., 2° C.) for a predetermined period of time (e.g., five seconds). In this case, the temperature of the coolant passing through the power electronics coolant line 12 may considerably differ from the temperature of the heat sink 25c. When the variation in the temperature of the heat sink 25c is greater than or equal to the predetermined threshold (e.g., 2° C.) for a predetermined period of time (e.g., five seconds), the temperature of the coolant passing through the power electronics coolant line 12 may not be determined based on the temperature sensed by the heat sink temperature sensor 29.

In a state in which the coolant system 10 including the first temperature sensor 81 disposed in the battery coolant line 11 and the second temperature sensor 82 disposed in the radiator coolant line 13 operates in the third circulation mode (see FIG. 5), the power electronics coolant line 12 may be fluidly separated from the battery coolant line 11, and the radiator coolant line 13 may be fluidly blocked from the control valve 30. When the variation in the temperature of the heat sink 25c sensed by the heat sink temperature sensor 29 is greater than or equal to the predetermined threshold (e.g., 2° C.) for a predetermined period of time (e.g., five seconds), the control valve 30 may perform the first switching operation or the fourth switching operation so that the coolant system 10 may switch from the third circulation mode to the first circulation mode (see FIG. 3) or the fourth circulation mode (see FIG. 6) for a predetermined period of time (e.g., ten seconds), and each of the battery pump 15 and the power electronic pump 16 may operate at maximum RPM. Accordingly, the coolant passing through the power electronics coolant line 12 may pass through the battery coolant line 11. As a result, the temperature of the coolant passing through the power electronics coolant line 12 may become similar to a temperature sensed by the temperature sensor 81 disposed in the battery coolant line 11, and the controller 100 may determine the temperature of the coolant passing through the power electronics coolant line 12 based on the temperature sensed by the temperature sensor 81 disposed in the battery coolant line 11.

Figure 8:
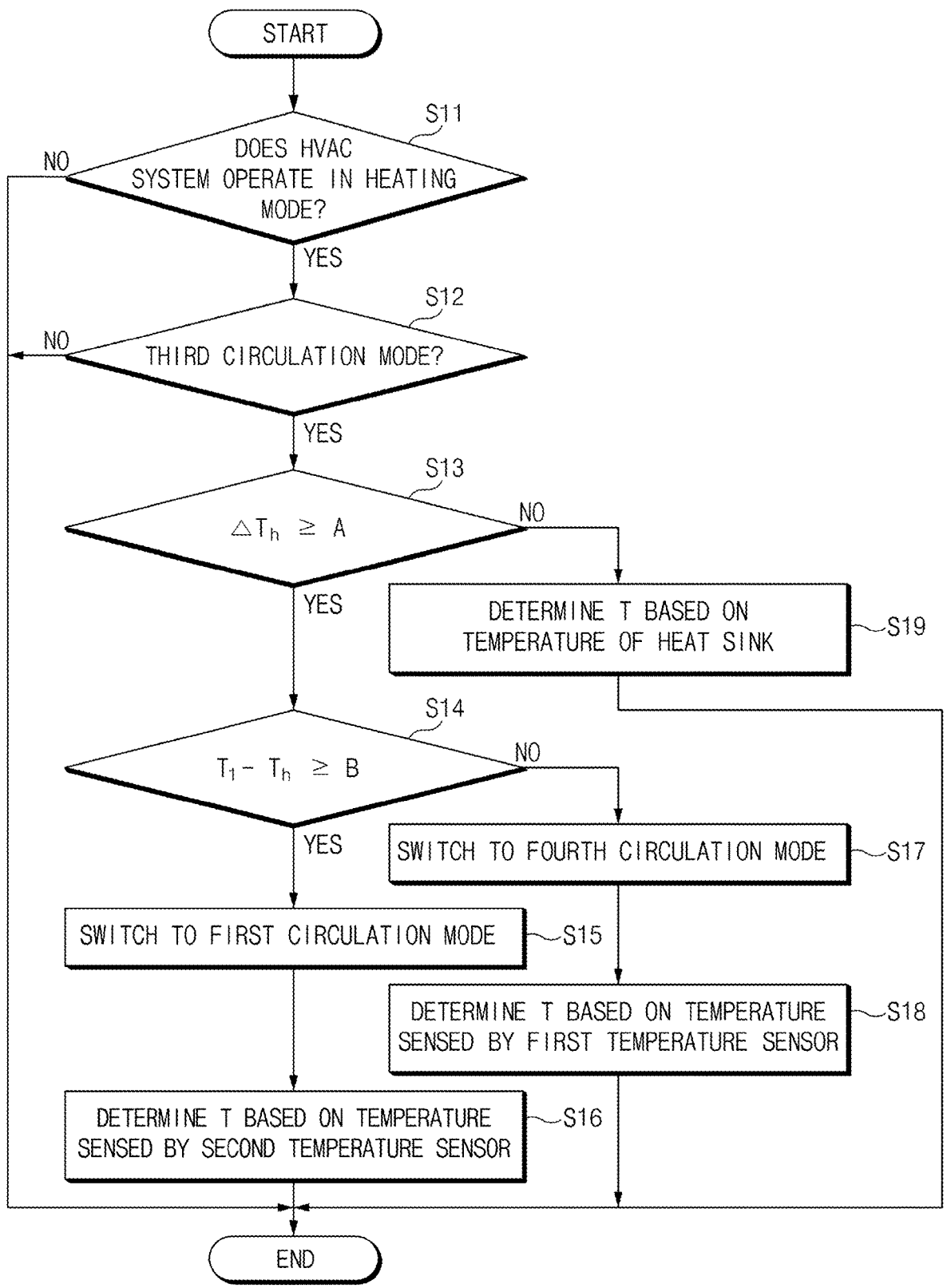
FIG. 8 illustrates an example of a flowchart of a method of controlling a coolant system.

FIG. 8 illustrates a method of controlling the coolant system 10 in FIG. 2.

The controller 100 may determine whether the HVAC system 40 operates in the heating mode (S11).

When it is determined that the HVAC system 40 operates in the heating mode, the controller 100 may determine whether the coolant system 10 operates in the third circulation mode (S12). In the third circulation mode, the power electronics coolant line 12 may be fluidly separated from the battery coolant line 11, and the radiator coolant line 13 may be fluidly blocked from the control valve 30. That is, when the coolant system 10 operates in the third circulation mode, the power electronics coolant line 12 may be fluidly separated from the battery coolant line 11 and the radiator coolant line 13.

When it is determined that the coolant system 10 operates in the third circulation mode, the controller 100 may determine whether a variation $\Delta T_h$ in temperature of the heat sink 25c sensed by the heat sink temperature sensor 29 is greater than or equal to a first predetermined threshold A (e.g., 2° C.)

for a predetermined period of time (e.g., five seconds) (S13). While the vehicle is running at a constant speed, the temperature of the heat sink 25c sensed by the heat sink temperature sensor 29 may be kept constant or the variation in the temperature of the heat sink 25c may be less than the predetermined threshold. While the vehicle is accelerating or decelerating, the vehicle speed may rapidly change or the torque of the electric motor 25a may rapidly change, and accordingly the variation in the temperature of the heat sink 25c sensed by the heat sink temperature sensor 29 may be greater than or equal to the predetermined threshold for a predetermined period of time.

When it is determined that the variation $\Delta T_h$ in the temperature of the heat sink 25c is greater than or equal to the first predetermined threshold A (e.g., 2° C.) for a predetermined period of time (e.g., five seconds), it may be determined whether a difference ($T_1-T_h$) between a temperature $T_1$ of the coolant passing through the battery coolant line 11 and a temperature $T_h$ of the heat sink 25c is greater than or equal to a second predetermined threshold B (e.g., 10° C.) (S14). The second predetermined threshold B may be greater than the first predetermined threshold A.

When it is determined that the difference ($T_1-T_h$) between the temperature $T_1$ of the coolant passing through the battery coolant line 11 and the temperature $T_h$ of the heat sink 25c is greater than or equal to the second predetermined threshold B (e.g., 10° C.), the controller 100 may control the switching operation of the control valve 30 so that the coolant system 10 may switch to the first circulation mode for a predetermined period of time (e.g., ten seconds) (S15). When the battery 21 is warmed up, the temperature of the coolant may relatively increase. Accordingly, when the difference ($T_1-T_h$) between the temperature $T_1$ of the coolant passing through the battery coolant line 11 and the temperature $T_h$ of the heat sink 25c is greater than or equal to the second predetermined threshold B (e.g., 10° C.), thermal shock may occur as the coolant passes through the heat sink 25c. To prevent this, as the coolant system 10 operates in the first circulation mode, the power electronics coolant line 12 may be fluidly separated from the battery coolant line 11 and be fluidly connected to the radiator coolant line 13 so that the coolant having passed through the battery coolant line 11 may not be directed to the power electronics coolant line 12. Here, the controller 100 may control the power electronic pump 16 in a manner that operates the power electronic pump 16 at maximum RPM. As the power electronic pump 16 operates at maximum RPM, thermal equilibrium may be quickly achieved between the temperature of the coolant passing through the power electronics coolant line 12 and the temperature of the coolant passing through the radiator coolant line 13. In addition, the controller 100 may control the active air flap 18 in a manner that closes the active air flap 18, and the controller 100 may control the cooling fan 19 in a manner that stops the cooling fan 19. By closing the active air flap 18, the front grille 17 may be fully closed. As the cooling fan 19 is stopped, the coolant passing through the radiator coolant line 13 may not be thermally affected by the ambient air. In a state in which the coolant system 10 switches to the first circulation mode for a predetermined period of time, the controller 100 may determine a temperature T of the coolant passing through the power electronics coolant line 12 based on a temperature sensed by the second temperature sensor 82 (S16).

When it is determined that the difference ($T_1-T_h$) between the temperature $T_1$ of the coolant passing through the battery coolant line 11 and the temperature $T_h$ of the heat sink 25c is less than the second predetermined threshold B (e.g., 10° C.), the controller 100 may control the switching operation of the control valve 30 so that the coolant system 10 may switch to the fourth circulation mode for a predetermined period of time (e.g., ten seconds) (S17). Here, the controller 100 may control the battery pump 15 and the power electronic pump 16 in a manner that operates the battery pump 15 and the power electronic pump 16 at maximum RPM. As the battery pump 15 and the power electronic pump 16 operate at maximum RPM, thermal equilibrium may be quickly achieved between the temperature of the coolant passing through the battery coolant line 11 and the temperature of the coolant passing through the power electronics coolant line 12.

In a state in which the coolant system 10 switches to the fourth circulation mode for a predetermined period of time, the controller 100 may determine the temperature T of the coolant passing through the power electronics coolant line 12 based on a temperature sensed by the first temperature sensor 81 (S18).

When it is determined that the variation $\Delta T_h$ in the temperature of the heat sink 25c is less than the first predetermined threshold A (e.g., 2° C.) for a predetermined period of time (e.g., five seconds), the controller 100 may determine the temperature T of the coolant passing through the power electronics coolant line 12 based on a temperature of the heat sink sensed by the heat sink temperature sensor 29 (S19).

As set forth above, the vehicular coolant system and the method of controlling the same may be designed to have the temperature sensor provided in at least one of the battery coolant line, the power electronics coolant line, or the radiator coolant line, control the switching operation(s) of the control valve under predetermined condition(s) in a manner that fluidly connects a coolant line without any temperature sensor to a coolant line with the temperature sensor, and determine the temperature of the coolant passing through the coolant line without any temperature sensor based on the temperature sensed by the temperature sensor. By reducing the number of temperature sensors, cost savings may be achieved and electric efficiency may be improved.

Hereinabove, although the present disclosure has been described with reference to exemplary implementations and the accompanying drawings, the present disclosure is not limited thereto, but may be variously modified and altered by those skilled in the art to which the present disclosure pertains without departing from the spirit and scope of the present disclosure claimed in the following claims.

What is claimed is:
1. A coolant system, comprising:
a battery coolant line fluidly connected to a battery;
a power electronics coolant line fluidly connected to a power electronic component;
a radiator coolant line fluidly connected to a radiator;
a control valve configured to allow the battery coolant line, the power electronics coolant line, and the radiator coolant line to be fluidly connected to or separated from one another;
a temperature sensor disposed at at least one of the battery coolant line, the power electronics coolant line, or the radiator coolant line; and
a controller configured to control the control valve to:
fluidly connect (i) a first coolant line that does not have the temperature sensor among the battery coolant line, the power electronics coolant line, and the radiator coolant line to (ii) a second coolant line that has the temperature sensor among the battery coolant line, the power electronics coolant line, and the radiator coolant line, and determine a first temperature of a coolant passing through the first coolant line based on a second temperature sensed by the temperature sensor disposed at the second coolant line.

2. The coolant system according to claim 1, wherein the temperature sensor is disposed at the battery coolant line.

3. The coolant system according to claim 1, wherein the temperature sensor comprises (i) a first temperature sensor disposed at the battery coolant line and (ii) a second temperature sensor disposed at the radiator coolant line.

4. The coolant system according to claim 1, further comprising a heat sink temperature sensor disposed at a heat sink of the power electronic component.

5. The coolant system according to claim 1, wherein the control valve comprises:
- a first battery-side port connected to an inlet of the battery coolant line;
- a second battery-side port connected to an outlet of the battery coolant line;
- a first power electronic-side port connected to an inlet of the power electronics coolant line;
- a second power electronic-side port connected to an outlet of the power electronics coolant line;
- a first radiator-side port connected to an inlet of the radiator coolant line; and
- a second radiator-side port connected to an outlet of the radiator coolant line.

6. The coolant system according to claim 5, wherein the control valve is configured to allow two or more of the first battery-side port, the second battery-side port, the first power electronic-side port, the second power electronic-side port, the first radiator-side port, or the second radiator-side port to selectively communicate with one another.

7. The coolant system according to claim 1, further comprising a battery pump fluidly connected to the battery coolant line.

8. The coolant system according to claim 1, further comprising a battery chiller that is fluidly connected to the battery coolant line and configured to thermally connect the battery coolant line to a heating, ventilation, and air conditioning (HVAC) system.

9. The coolant system according to claim 1, further comprising a power electronic pump fluidly connected to the power electronics coolant line.

10. The coolant system according to claim 1, further comprising a heat exchanger that is fluidly connected to the power electronics coolant line and configured to thermally connect the power electronics coolant line to an HVAC system.

11. A method for controlling a coolant system, the coolant system including a battery coolant line fluidly connected to a battery, a power electronics coolant line fluidly connected to a power electronic component, a radiator coolant line fluidly connected to a radiator, and a control valve configured to control flow of a coolant through the battery coolant line, the power electronics coolant line, and the radiator coolant line, the method comprising:

obtaining a temperature of a heat sink of the power electronic component;

determining whether a variation of the temperature of the heat sink of the power electronic component is greater than or equal to a predetermined threshold in a first circulation mode in which the power electronics coolant line is fluidly separated from the battery coolant line;

based on determining that the variation of the temperature of the heat sink of the power electronic component is greater than or equal to the predetermined threshold, switching to a second circulation mode in which the power electronics coolant line is fluidly connected to the battery coolant line;

obtaining a first temperature sensed by a temperature sensor that is disposed at the battery coolant line; and determining a second temperature of the coolant passing through the power electronics coolant line based on the first temperature sensed by the temperature sensor disposed at the battery coolant line.

12. The method according to claim 11, further comprising:

based on determining that the variation of the temperature of the heat sink of the power electronic component is less than the predetermined threshold, obtaining a third temperature that is sensed by a heat sink temperature sensor; and determining the second temperature of the coolant passing through the power electronics coolant line based on the third temperature sensed by the heat sink temperature sensor.

13. A method for controlling a coolant system, the coolant system including a battery coolant line fluidly connected to a battery, a power electronics coolant line fluidly connected to a power electronic component, a radiator coolant line fluidly connected to a radiator, and a control valve configured to control flow of a coolant through the battery coolant line, the power electronics coolant line, and the radiator coolant line, the method comprising:

obtaining a temperature of a heat sink of the power electronic component;

determining whether a variation of the temperature of the heat sink of the power electronic component is greater than or equal to a first predetermined threshold in a first circulation mode in which the power electronics coolant line is fluidly separated from the battery coolant line and the radiator coolant line;

based on determining that the variation of the temperature of the heat sink of the power electronic component is greater than or equal to the first predetermined threshold, determining a temperature difference between a first temperature of the coolant passing through the battery coolant line and the temperature of the heat sink;

determining whether the temperature difference is greater than or equal to a second predetermined threshold;

based on determining that the temperature difference is greater than or equal to the second predetermined threshold, switching to a second circulation mode in which the power electronics coolant line is fluidly connected to the radiator coolant line; and obtaining a first sensor temperature sensed by a first temperature sensor disposed at the radiator coolant line; and determining a second temperature of the coolant passing through the power electronics coolant line based on the first sensor temperature sensed by the first temperature sensor disposed at the radiator coolant line.

14. The method according to claim 13, further comprising:

obtaining a second sensor temperature sensed by a heat sink temperature sensor based on determining that the variation of the temperature of the heat sink of the power electronic component is less than the first predetermined threshold;

determining the second temperature of the coolant passing through the power electronics coolant line based on the second sensor temperature sensed by the heat sink temperature sensor.

15. The method according to claim 13, further comprising:

switching to a third circulation mode in which the power electronics coolant line is fluidly connected to the battery coolant line based on determining that the temperature difference is less than the second predetermined threshold;

obtaining a second sensor temperature sensed by a second temperature sensor disposed at the battery coolant line; and determining the second temperature of the coolant passing through the power electronics coolant line based on the second sensor temperature sensed by the second temperature sensor disposed at the battery coolant line.

* * * * *